(12) United States Patent
Stelzer et al.

(10) Patent No.: US 7,594,226 B2
(45) Date of Patent: Sep. 22, 2009

(54) IMPLEMENTATION OF PACKET-BASED COMMUNICATIONS IN A RECONFIGURABLE HARDWARE ELEMENT

(75) Inventors: Timothy A. Stelzer, Austin, TX (US); William R. Pitts, Austin, TX (US); Rodney W. Cummings, Austin, TX (US); Brian Keith Odom, Austin, TX (US); Craig M. Conway, Austin, TX (US)

(73) Assignee: National Instruments Corporation, Austin, TX (US)

( * ) Notice: Subject to any disclaimer, the term of this patent is extended or adjusted under 35 U.S.C. 154(b) by 745 days.

(21) Appl. No.: 11/203,805

(22) Filed: Aug. 15, 2005

(65) Prior Publication Data

US 2006/0037008 A1 Feb. 16, 2006

Related U.S. Application Data

(60) Provisional application No. 60/601,820, filed on Aug. 16, 2004.

(51) Int. Cl.
  *G06F 9/445* (2006.01)
  *G06F 9/44* (2006.01)
(52) U.S. Cl. .................. 717/178; 717/173; 717/105; 717/109
(58) Field of Classification Search .............. 717/109, 717/178
  See application file for complete search history.

(56) References Cited

U.S. PATENT DOCUMENTS 6,219,628 B1 4/2001 Kodosky et al.
6,584,601 B1 * 6/2003 Kodosky et al. ............... 716/4
6,608,638 B1 8/2003 Kodosky et al.
6,671,869 B2 * 12/2003 Davidson et al. ............ 717/136
6,784,903 B2 8/2004 Kodosky et al.
6,823,283 B2 11/2004 Steger et al.
6,934,667 B2 8/2005 Kodosky et al.
6,934,668 B2 8/2005 Kodosky et al.

(Continued)

OTHER PUBLICATIONS

Dozsa et al., "Development of Graphical Parallel Programs in KVM Environments", Hungarian Academy of Sciences, 1996, 8 pgs.*

(Continued)

*Primary Examiner*—Wei Y Zhen
*Assistant Examiner*—Ryan D Coyer
(74) *Attorney, Agent, or Firm*—Meyertons Hood Kivlin Kowert & Goetzel, P.C.; Jeffrey C. Hood

(57) ABSTRACT

In some embodiments, a user may select an elemental function such as read, write, or configuration from a graphical programming environment. A file may be created that instantiates functionality into a programmable hardware element to allow it to send a command across a serial protocol to peripheral interface circuitry and ultimately to peripheral chips (e.g., network chips on a CAN). The elemental node concept may be generic to any network chip because the node may contain only the general data of a packet (e.g., command type, value of data bytes, etc). The actual interface to a network chip may be handled inside the peripheral interface circuitry. The peripheral interface circuitry may have the details of the network chip in which it interfaces and may abstract details of the network chip from the target programmable hardware element through the serial protocol.

16 Claims, 24 Drawing Sheets

U.S. PATENT DOCUMENTS

| | | | |
|---|---|---|---|
| 6,948,167 B1 * | 9/2005 | Queisser et al. | 717/177 |
| 6,954,724 B2 | 10/2005 | Kodosky et al. | |
| 6,961,686 B2 | 11/2005 | Kodosky et al. | |
| 6,983,228 B2 | 1/2006 | Kodosky et al. | |
| 6,993,466 B2 | 1/2006 | Kodosky et al. | |
| 7,010,470 B2 | 3/2006 | Kodosky et al. | |
| 7,478,337 B2 * | 1/2009 | Kodosky et al. | 715/771 |
| 2003/0038842 A1 | 2/2003 | Peck et al. | |
| 2003/0163298 A1 | 8/2003 | Odom et al. | |

OTHER PUBLICATIONS

Schwan et al., "High-performance operating system primitives for robotics and real-time control systems", ACM, TOCS, Aug. 1987, pp. 189-231.*

* cited by examiner

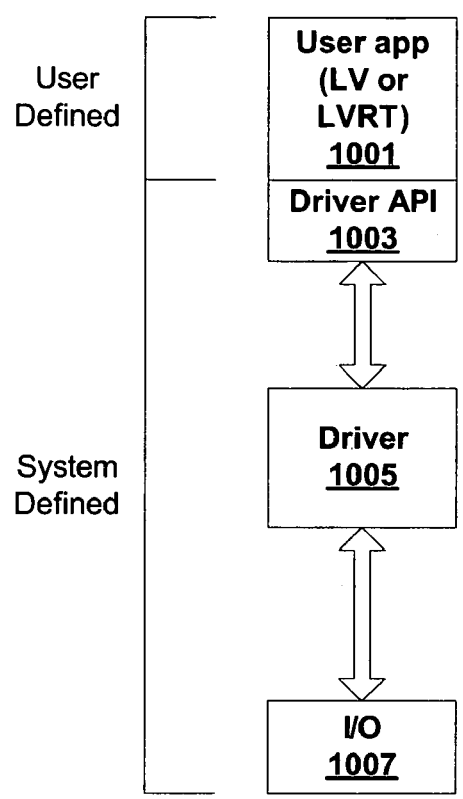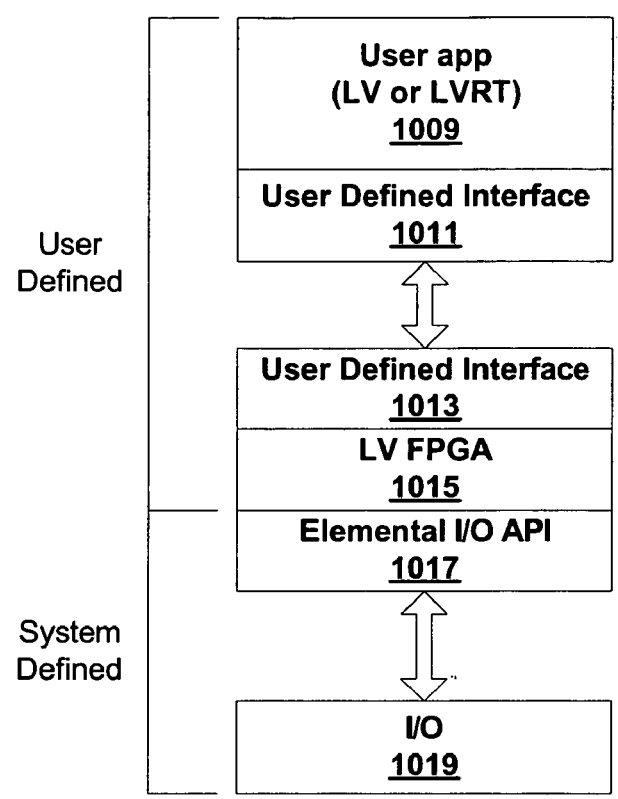
*FIG. 10a*  *FIG. 10b*

IMPLEMENTATION OF PACKET-BASED COMMUNICATIONS IN A RECONFIGURABLE HARDWARE ELEMENT

PRIORITY

This application claims priority to U.S. Provisional Patent Application Ser. No. 60/601,820 titled "Representation of a Communications Packet in a Reprogrammable Graphical Programming Environment", which was filed Aug. 16, 2004, whose inventors are Timothy A. Stelzer, William R. Pitts, Rodney Cummings, Brian Keith Odom, and Craig M. Conway which is hereby incorporated by reference in its entirety as though fully and completely set forth herein.

FIELD OF THE INVENTION

The present invention relates to the field of graphical programming, and more particularly to a system and method for representing a communications packet in a reprogrammable graphical programming environment.

DESCRIPTION OF THE RELATED ART

Traditionally, high level text-based programming languages have been used by programmers in writing application programs. Many different high level text-based programming languages exist, including BASIC, C, C++, Java, FORTRAN, Pascal, COBOL, ADA, APL, etc. Programs written in these high level text-based languages are translated to the machine language level by translators known as compilers or interpreters. The high level text-based programming languages in this level, as well as the assembly language level, are referred to herein as text-based programming environments.

Increasingly, computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. The task of programming a computer system to model or implement a process often is further complicated by the fact that a sequence of mathematical formulas, steps or other procedures customarily used to conceptually model a process often does not closely correspond to the traditional text-based programming techniques used to program a computer system to model such a process. In other words, the requirement that a user program in a text-based programming environment places a level of abstraction between the user's conceptualization of the solution and the implementation of a method that accomplishes this solution in a computer program. Thus, a user often must substantially master different skills in order to both conceptualize a problem or process and then to program a computer to implement a solution to the problem or process. Since a user often is not fully proficient in techniques for programming a computer system in a text-based environment to implement his solution, the efficiency with which the computer system can be utilized often is reduced.

To overcome the above shortcomings, various graphical programming environments now exist which allow a user to construct a graphical program or graphical diagram, also referred to as a block diagram. U.S. Pat. Nos. 4,901,221; 4,914,568; 5,291,587; 5,301,301; and 5,301,336; among others, to Kodosky et al disclose a graphical programming environment which enables a user to easily and intuitively create a graphical program. Graphical programming environments such as that disclosed in Kodosky et al can be considered a higher and more intuitive way in which to interact with a computer. A graphically based programming environment can be represented at a level above text-based high level programming languages such as C, Basic, Java, etc.

A user may assemble a graphical program by selecting various icons or nodes which represent desired functionality, and then connecting the nodes together to create the program. The nodes or icons may be connected by lines representing data flow between the nodes, control flow, or execution flow. Thus the block diagram may include a plurality of interconnected icons such that the diagram created graphically displays a procedure or method for accomplishing a certain result, such as manipulating one or more input variables and/ or producing one or more output variables. In response to the user constructing a diagram or graphical program using the block diagram editor, data structures and/or program instructions may be automatically constructed which characterize an execution procedure that corresponds to the displayed procedure. The graphical program may be compiled or interpreted by a computer.

A graphical program may have a graphical user interface. For example, in creating a graphical program, a user may create a front panel or user interface panel. The front panel may include various graphical user interface elements or front panel objects, such as user interface controls and/or indicators, that represent or display the respective input and output that will be used by the graphical program, and may include other icons which represent devices being controlled.

Thus, graphical programming has become a powerful tool available to programmers. Graphical programming environments such as the National Instruments LabVIEW product have become very popular. Tools such as LabVIEW have greatly increased the productivity of programmers, and increasing numbers of programmers are using graphical programming environments to develop their software applications. In particular, graphical programming tools are being used for test and measurement, data acquisition, process control, man machine interface (MMI), supervisory control and data acquisition (SCADA) applications, modeling, simulation, image processing/machine vision applications, and motion control, among others.

SUMMARY

Various embodiments comprise a system and method for implementing a packet-based communications in a reconfigurable hardware element. In some embodiments, a graphical programming environment may be used to program a communications packet onto reprogrammable hardware (e.g., a target field-programmable gate array (FPGA)) to transmit a representation of the communications packet to module hardware (which may include peripheral interface circuitry).

In some embodiments, a graphical programming environment may be used to select an operation on a communications packet. Operations may include read, write, and configure. Other operations are also contemplated. In some embodiments, the graphical programming environment may include a LabVIEW interface used to program an FPGA. In some embodiments, a graphical program may be created on the computer system. The graphical program may be created or assembled by the user arranging a plurality of nodes or icons on a display and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons that visually indicate the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW graphical programming development environment to create the graphical program.

In some embodiments, a representation of the communications packet may be translated into hardware. For example, the representation may be translated into hardware in the form of reconfigurable logic inside a target LabVIEW FPGA. Other translations and hardware are also contemplated. In some embodiments, the target FPGA may be programmed with the representation from code in a diagram of the graphical programming environment. In some embodiments, the communications packet representation may be serialized (e.g., using a custom serial protocol).

In some embodiments, information from the hardware description, e.g., communications packets generated from a graphical program, etc., may be transferred to the module hardware that contains peripheral interface circuitry (e.g., an FPGA). In some embodiments, another form of digital logic may be used instead of or in addition to the peripheral interface circuitry. In some embodiments, the communications packet representation may be received by the peripheral interface circuitry. The peripheral interface circuitry may have fixed functionality that may not be configurable via the target FPGA. In some embodiments, the interface may include a collection of shared pins between a graphical programming environment and the module hardware. In some embodiments, the module hardware de-serializes the communications packet from the interface and implements the packet onto the FPGA.

In some embodiments, a user may use the graphical programming environment to select an elemental Controller Area Network (CAN) function, such as CAN read, CAN write, or CAN configuration as an operation on a communications packet. In some embodiments, the CAN function may be selected from a LabVIEW FPGA palette. Other functions for other industrial buses (e.g., a Foundation fieldbus, Profibus, Devicenet, or any other field bus or device bus) may also be used. The user may also run the virtual instrument (VI). The VI may generate a bitstream (or net list) that instantiates functionality into the LabVIEW FPGA to allow it to send a particular command (read/write/configuration) across the serial protocol to the Module FPGA and ultimately to peripheral chips (which may be network chips on a CAN). Other peripheral chips are also contemplated. In some embodiments, an elemental node concept may be generic to any network chip because the node may contain only the general data of a packet (e.g., command type, value of data bytes, etc). In some embodiments, the actual interface to the network chip may be handled inside the module FPGA. In some embodiments, the module FPGA may have the details of the network chip in which it interfaces and, therefore, may abstract details of the network chip from the LabVIEW FPGA through the serial protocol.

BRIEF DESCRIPTION OF THE DRAWINGS

A better understanding of the present invention may be obtained when the following detailed description is considered in conjunction with the following drawings, in which:

FIGS. 10a and 10b illustrates embodiments of user and system defined applications and drivers;

Figure 1A:
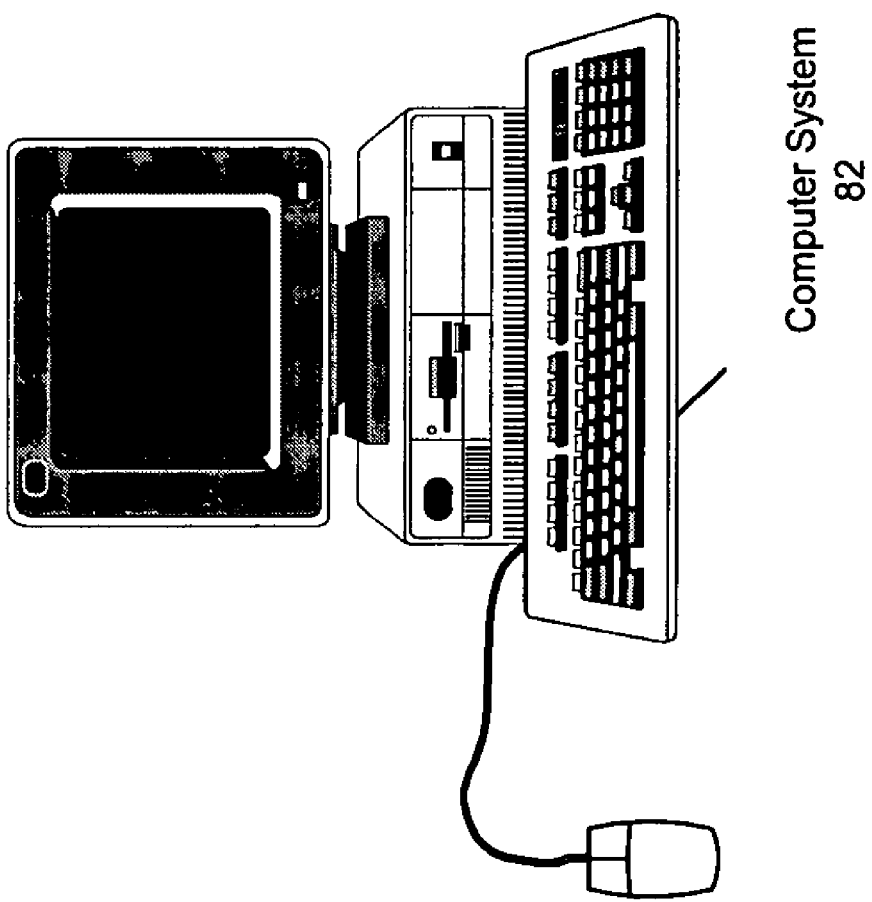
FIG. 1A illustrates a computer system operable to execute a graphical program according to an embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE PREFERRED EMBODIMENTS

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

U.S. Provisional Application, Ser. No. 60/535,248, titled "A Graphical Program Which Includes an I/O Node For Hardware Abstraction" filed Jan. 9, 2004.

U.S. patent application Ser. No. 10/094,198, titled "Self-Determining Behavior Node for Use in Creating a Graphical Program" filed Mar. 8, 2002.

U.S. patent application Ser. No. 10/928,383, titled "Compact Input Measurement Module" filed Aug. 27, 2004.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as signals such as electrical, electromagnetic, or digital signals, conveyed via a communication medium such as a bus, network and/or a wireless link.

Programmable Hardware Element—includes various types of programmable hardware, reconfigurable hardware (reprogrammable hardware), programmable logic, or field-programmable devices (FPDs), such as one or more FPGAs (Field Programmable Gate Arrays), or one or more PLDs (Programmable Logic Devices), such as one or more Simple PLDs (SPLDs) or one or more Complex PLDs (CPLDs), or other types of programmable hardware. A programmable hardware element may also be referred to as "reconfigurable logic". A programmable hardware element may also include a processor, an FPGA with an integrated processor, and a digital signal processing (DSP) device.

Medium—includes one or more of a memory medium, carrier medium, and/or programmable hardware element; encompasses various types of mediums that can either store program instructions/data structures or can be configured with a hardware configuration program. For example, a medium that is "configured to perform a function or implement a software object" may be 1) a memory medium or carrier medium that stores program instructions, such that the program instructions are executable by a processor to perform the function or implement the software object; 2) a medium carrying signals that are involved with performing the function or implementing the software object; and/or 3) a programmable hardware element configured with a hardware configuration program to perform the function or implement the software object.

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Graphical Program—A program comprising a plurality of interconnected nodes or icons, wherein the plurality of interconnected nodes or icons visually indicate functionality of the program.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, Vis Sim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, Vis Sim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Node—In the context of a graphical program, an element that may be included in a graphical program. A node may have an associated icon that represents the node in the graphical program, as well as underlying code or data that implements functionality of the node. Exemplary nodes include function nodes, terminal nodes, structure nodes, etc. Nodes may be connected together in a graphical program by connection icons or wires.

Data Flow Graphical Program (or Data Flow Diagram)—A graphical program or diagram comprising a plurality of interconnected nodes, wherein the connections between the nodes indicate that data produced by one node is used by another node.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a graphical program. In this instance, various mechanisms may be used to connect GUI Elements in the GUI with nodes in the graphical program. For example, when Input Controls and Output Indicators are created in the GUI, corresponding nodes (e.g., terminals) may be automatically created in the graphical program or block diagram. Alternatively, the user can place terminal nodes in the block diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program, and view output of the program, while the program is executing.

A front panel is a type of GUI. A front panel may be associated with a graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

FIG. 1A—Computer System

FIG. 1A illustrates a computer system 82 operable to execute a graphical program configured to represent communication packets and operations on communication packets. An embodiment of a method for creating a graphical program operable to represent communication packets and operations on communication packets is described below.

As shown in FIG. 1A, the computer system 82 may include a display device operable to display the graphical program as the graphical program is created and/or executed. The display device may also be operable to display a graphical user interface or front panel of the graphical program during execution of the graphical program. The graphical user interface may comprise any type of graphical user interface, e.g., depending on the computing platform.

The computer system 82 may include a memory medium(s) on which one or more computer programs or software components according to various embodiments may be stored. For example, the memory medium may store one or more graphical programs which are executable to perform the methods described herein. Also, the memory medium may store a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

Figure 1B:
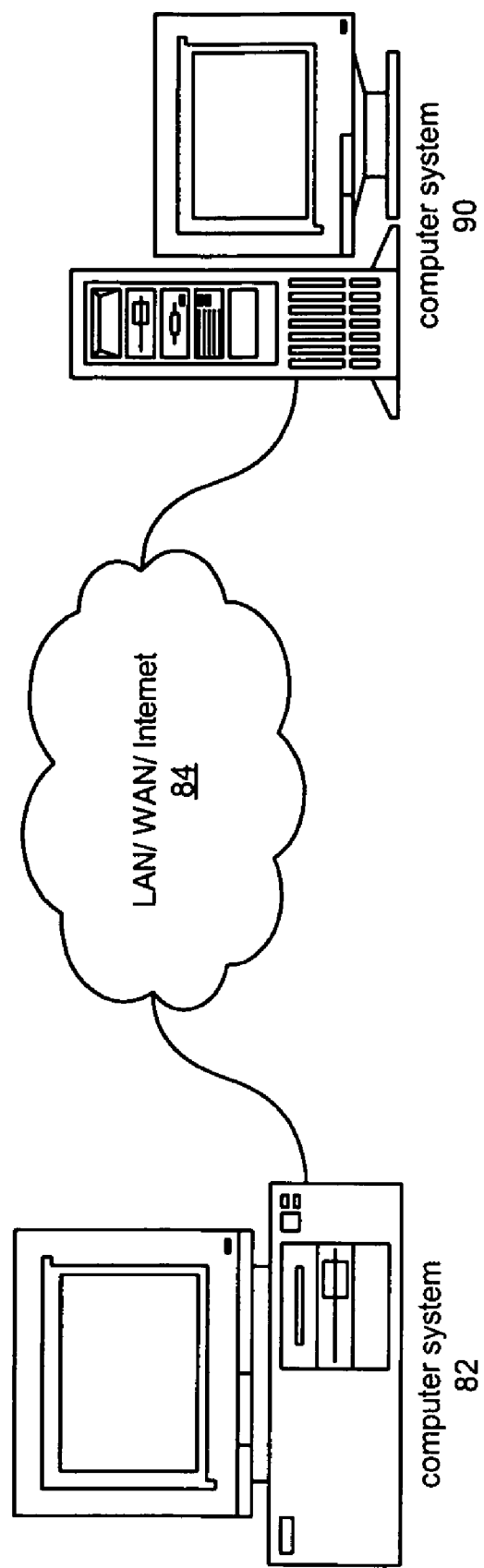
FIG. 1B illustrates a network system comprising two or more computer systems that may implement an embodiment.

FIG. 1B—Computer Network

FIG. 1B illustrates a system including a first computer system 82 that is coupled to a second computer system 90. The computer system 82 may be connected through a network 84 (or a computer bus) to the second computer system 90. The computer systems 82 and 90 may each be any of various types, as desired. The network 84 can also be any of various types, including a LAN (local area network), WAN (wide area network), the Internet, or an Intranet, among others. The computer systems 82 and 90 may execute a graphical program in a distributed fashion. For example, computer 82 may execute a first portion of the block diagram of a graphical program and computer system 90 may execute a second portion of the block diagram of the graphical program. As another example, computer 82 may display the graphical user interface of a graphical program and computer system 90 may execute the block diagram of the graphical program.

In some embodiments, the graphical user interface of the graphical program may be displayed on a display device of the computer system 82, and the block diagram may execute on a device 190 connected to the computer system 82. The device 190 may include a programmable hardware element and/or may include a processor and memory medium which may execute a real time operating system. In some embodiments, the graphical program may be downloaded and executed on the device 190. For example, an application development environment with which the graphical program is associated may provide support for downloading a graphical program for execution on the device in a real time system.

Exemplary Systems

Various embodiments may be involved with performing test and/or measurement functions; controlling and/or modeling instrumentation or industrial automation hardware; modeling and simulation functions, e.g., modeling or simulating a device or product being developed or tested, etc. Exemplary test applications where the graphical program may be used include hardware-in-the-loop testing and rapid control prototyping, among others.

However, it is noted that various embodiments may be used for a plethora of applications and is not limited to the above applications. In other words, applications discussed in the present description are exemplary only, and various embodiments may be used in any of various types of systems. Thus, various embodiments of these systems and methods are operable to be used in any of various types of applications, including the control of other types of devices such as multimedia devices, video devices, audio devices, telephony devices, Internet devices, etc., as well as general purpose software applications such as word processing, spreadsheets, network control, network monitoring, financial applications, games, etc.

Figure 2A:
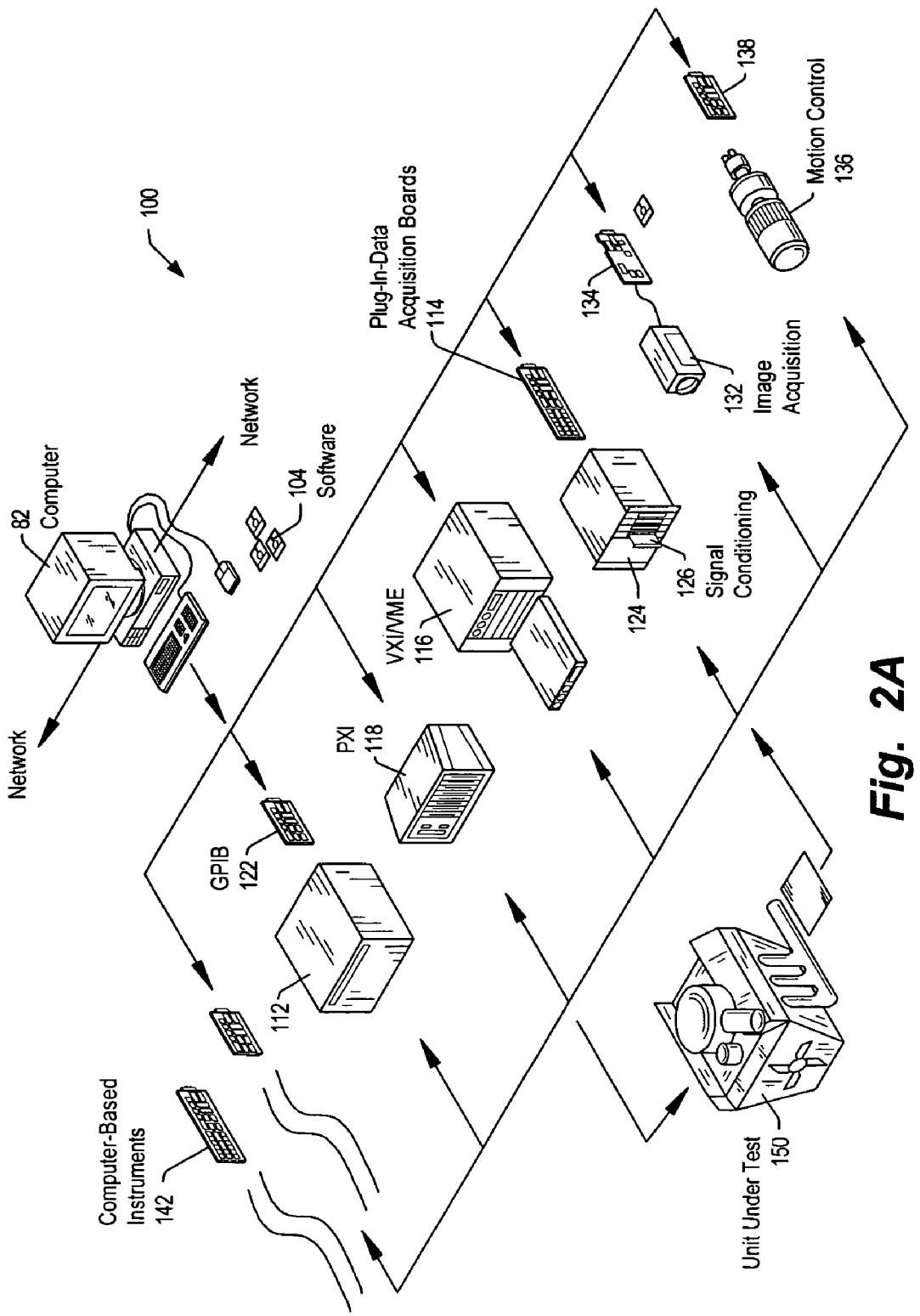
FIG. 2A illustrates an instrumentation control system according to an embodiment.

FIG. 2A illustrates an exemplary instrumentation control system 100 which may implement various embodiments. The system 100 comprises a host computer 82 that connects to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150.

The one or more instruments may include a GPIB instrument 112 and associated GPIB interface card 122, a data acquisition board 114 and associated signal conditioning circuitry 124, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to a unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
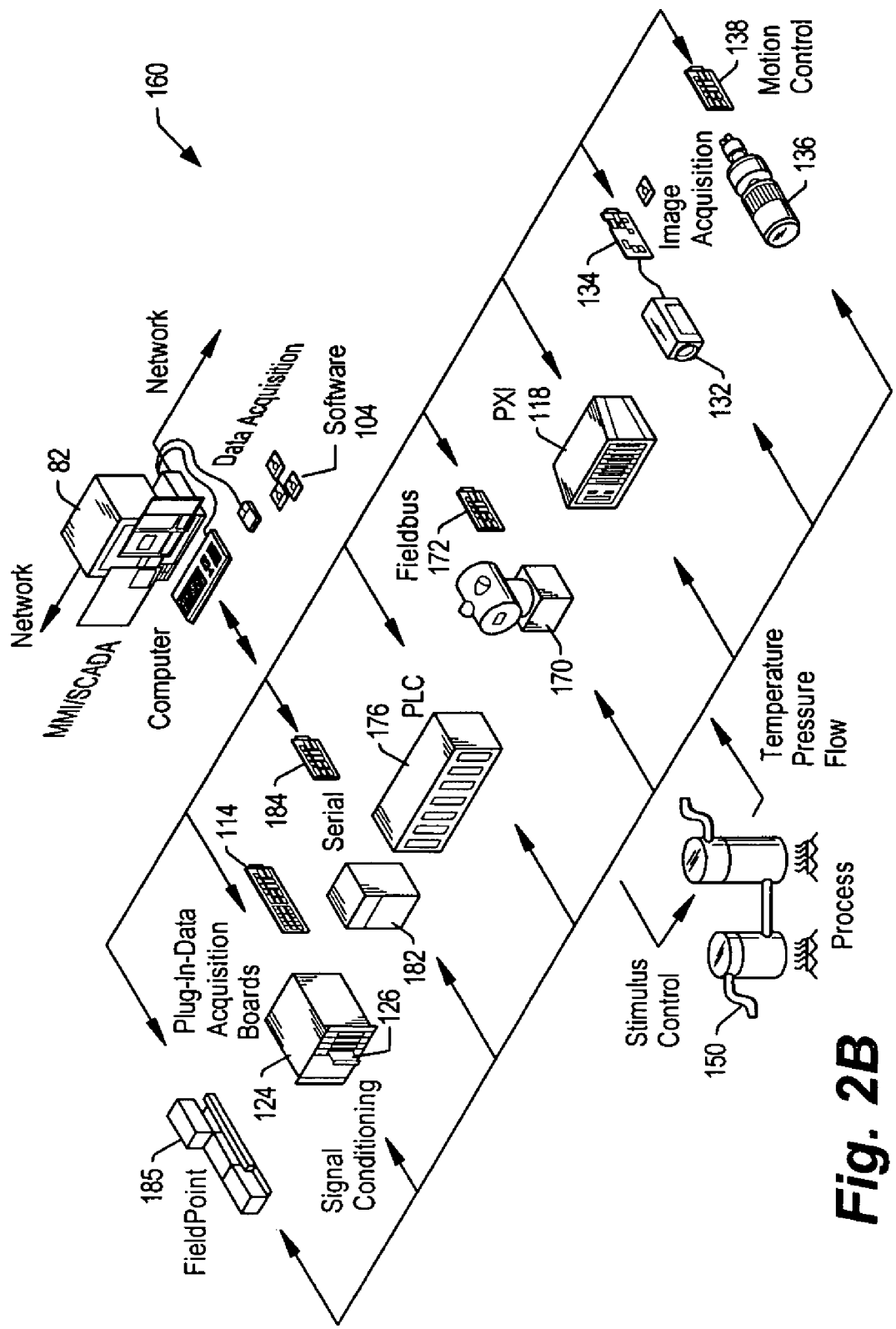
FIG. 2B illustrates an industrial automation system according to an embodiment.

FIG. 2B illustrates an exemplary industrial automation system 160 that may implement various embodiments. The industrial automation system 160 is similar to the instrumentation or test and measurement system 100 shown in FIG. 2A. Elements which are similar or identical to elements in FIG. 2A have the same reference numerals for convenience. The system 160 may comprise a computer 82 that connects to one or more devices or instruments. The computer 82 may comprise a CPU, a display screen, memory, and one or more input devices such as a mouse or keyboard as shown. The computer 82 may operate with the one or more devices to a process or device 150 to perform an automation function, such as MMI (Man Machine Interface), SCADA (Supervisory Control and Data Acquisition), portable or distributed data acquisition, process control, advanced analysis, or other control, among others.

The one or more devices may include a data acquisition board 114 and associated signal conditioning circuitry 124, a PXI instrument 118, a video device 132 and associated image acquisition card 134, a motion control device 136 and associated motion control interface card 138, a fieldbus device 170 and associated fieldbus interface card 172, a PLC (Programmable Logic Controller) 176, a serial instrument 182 and associated serial interface card 184, or a distributed data acquisition system, such as the Fieldpoint system available from National Instruments, among other types of devices.

Figure 3A:
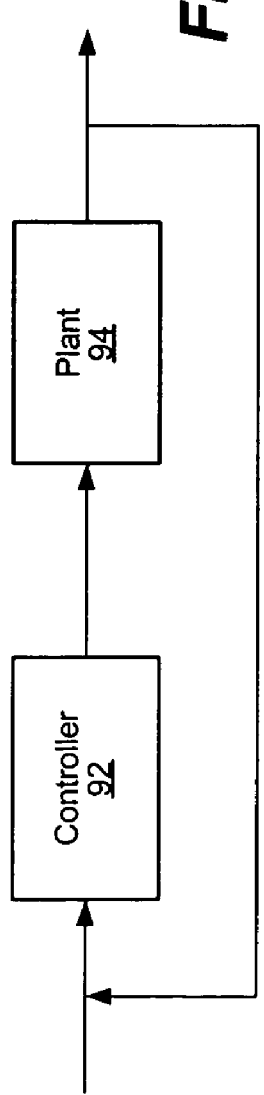
FIG. 3A is a high level block diagram of an exemplary system which may execute or utilize graphical programs.

FIG. 3A is a high-level block diagram of an exemplary system that may execute or utilize graphical programs. FIG.

3A illustrates a general high-level block diagram of a generic control and/or simulation system that comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) As shown, a user may create a graphical program that specifies or implements the functionality of one or both of the controller 92 and the plant 94. For example, a control engineer may use a modeling and simulation tool to create a model (graphical program) of the plant 94 and/or to create the algorithm (graphical program) for the controller 92.

Figure 3B:
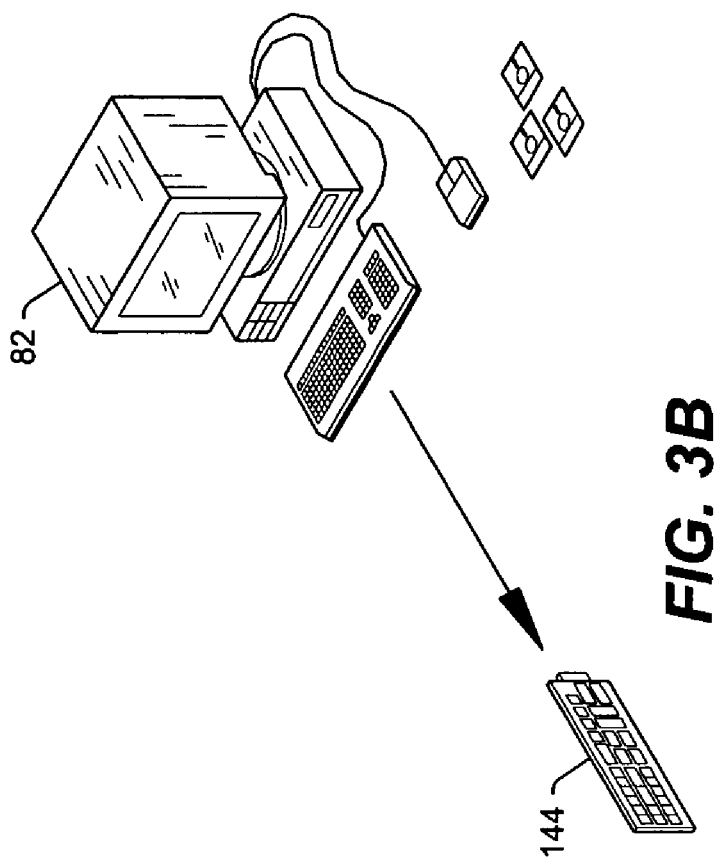
FIG. 3B illustrates an exemplary system which may perform control and/or simulation functions utilizing graphical programs.

FIG. 3B illustrates an exemplary system that may perform control and/or simulation functions. As shown, the controller 92 may be implemented by a computer system 82 or other device (e.g., including a processor and memory medium and/or including a programmable hardware element) that executes or implements a graphical program. In a similar manner, the plant 94 may be implemented by a computer system or other device 144 (e.g., including a processor and memory medium and/or including a programmable hardware element) that executes or implements a graphical program, or may be implemented in or as a real physical system, e.g., a car engine.

In some embodiments, one or more graphical programs may be created which are used in performing rapid control prototyping. Rapid Control Prototyping (RCP) generally refers to the process by which a user develops a control algorithm and quickly executes that algorithm on a target controller connected to a real system. The user may develop the control algorithm using a graphical program, and the graphical program may execute on the controller 92, e.g., on a computer system or other device. The computer system 82 may be a platform that supports real time execution, e.g., a device including a processor that executes a real time operating system (RTOS), or a device including a programmable hardware element.

In some embodiments, one or more graphical programs may be created which are used in performing Hardware in the Loop (HIL) simulation. Hardware in the Loop (HIL) refers to the execution of the plant model 94 in real time to test operation of a real controller 92. For example, once the controller 92 has been designed, it may be expensive and complicated to actually test the controller 92 thoroughly in a real plant, e.g., a real car. Thus, the plant model (implemented by a graphical program) is executed in real time to make the real controller 92 "believe" or operate as if it is connected to a real plant, e.g., a real engine.

In the embodiments of FIGS. 2A, 2B, and 3B above, one or more of the various devices may couple to each other over a network, such as the Internet. In some embodiments, the user operates to select a target device from a plurality of possible target devices for programming or configuration using a graphical program. Thus the user may create a graphical program on a computer and use (execute) the graphical program on that computer or deploy the graphical program to a target device (for remote execution on the target device) that is remotely located from the computer and coupled to the computer through a network.

Graphical software programs which perform data acquisition, analysis and/or presentation, e.g., for measurement, instrumentation control, industrial automation, modeling, or simulation, such as in the applications shown in FIGS. 2A and 2B, may be referred to as virtual instruments.

Figure 4:
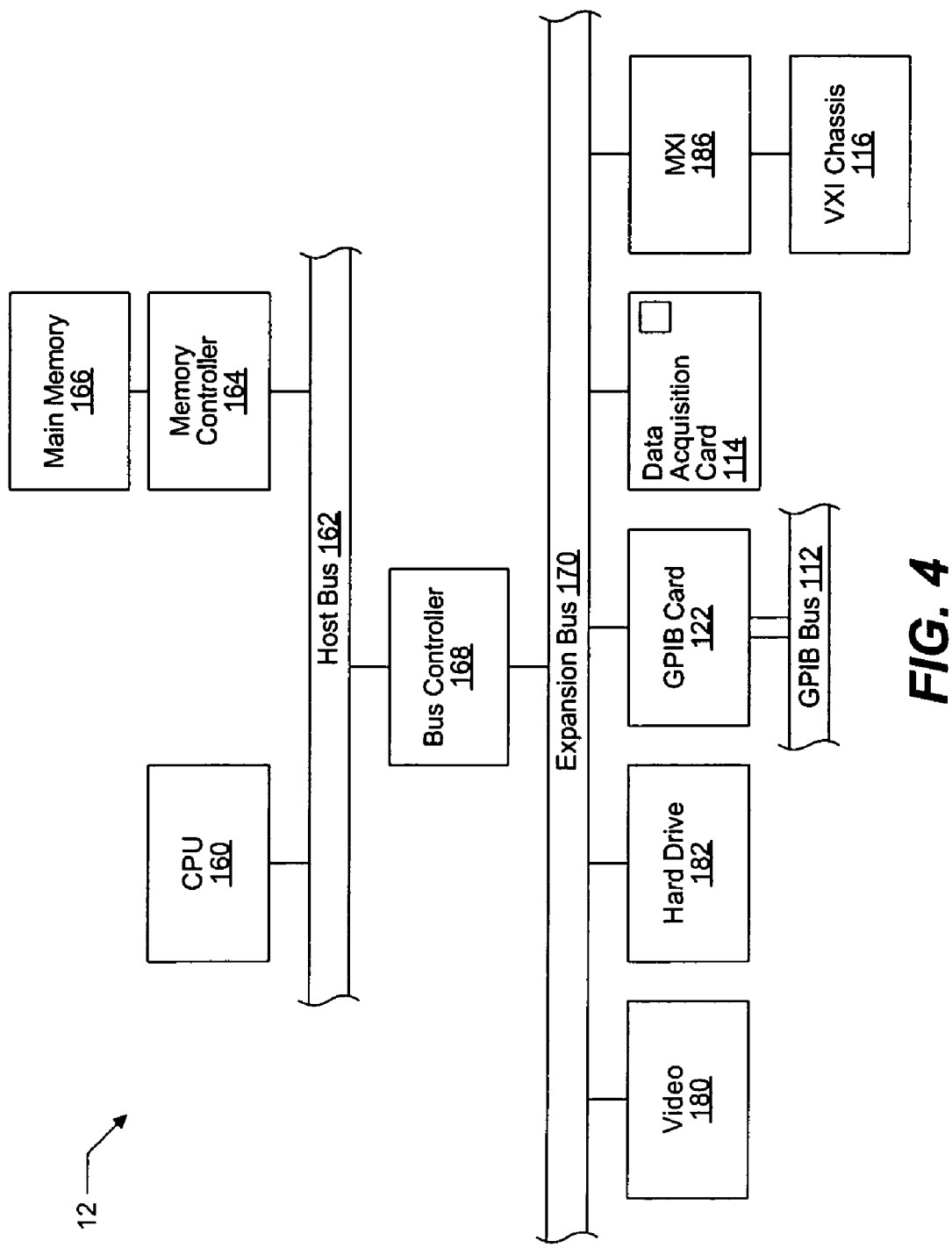
FIG. 4 is an exemplary block diagram of the computer systems of FIGS. 1A, 1B, 2A and 2B and 3B.

FIG. 4—Computer System Block Diagram

FIG. 4 is a block diagram representing an embodiment of the computer system 82 and/or 90 illustrated in FIGS. 1A and 1B, or computer system 82 shown in FIG. 2A or 2B. It is noted that any type of computer system configuration or architecture can be used as desired, and FIG. 4 illustrates a representative PC embodiment. It is also noted that the computer system may be a general purpose computer system, a computer implemented on a card installed in a chassis, or other types of embodiments. Elements of a computer not necessary to understand the present description have been omitted for simplicity.

The computer may include at least one central processing unit or CPU (processor) 160 that is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the graphical program operable to represent communication packets and operations on communication packets. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, a device 190 may also be connected to the computer. The device 190 may include a processor and memory that may execute a real time operating system. The device 190 may also or instead comprise a programmable hardware element. The computer system may be operable to deploy a graphical program to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program.

FIG. 5—Flowchart

Figure 5:
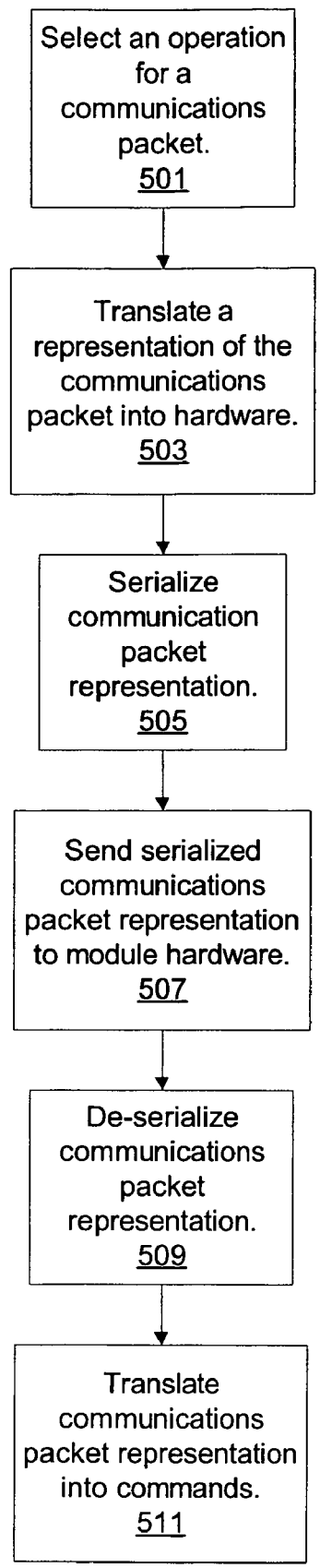
FIG. 5 is a flowchart diagram illustrating an embodiment of a method for representing a communications packet in a reprogrammable graphical programming environment.
Figure 6:
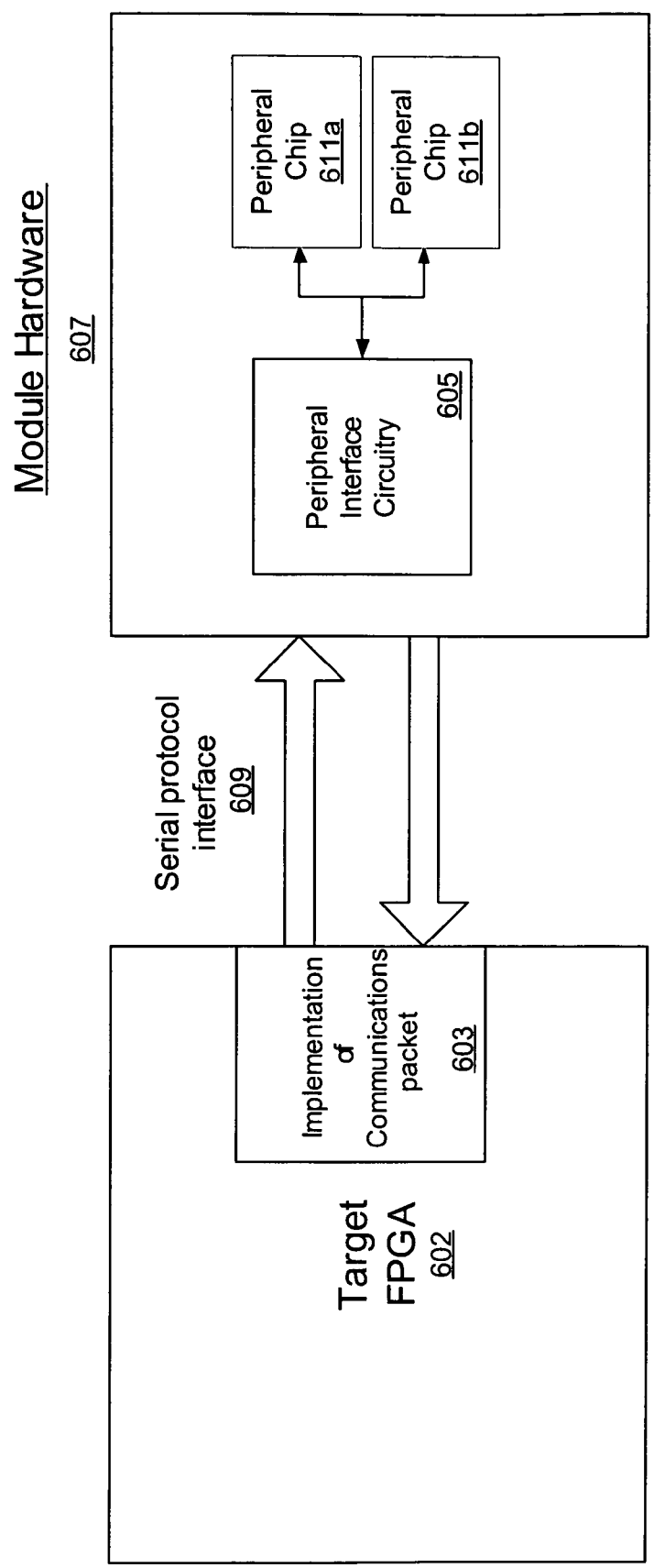
FIG. 6 illustrates an embodiment of a graphical programming environment coupled to module hardware.

FIG. 5 illustrates a method for implementing a communications packet in a reconfigurable hardware element. The method shown in FIG. 5 may be used in conjunction with any of the computer systems or devices shown in the above Figures, among other devices. FIG. 6 also shows an embodiment of a system that may be used in conjunction with the method shown in FIG. 5. FIG. 6 illustrates an embodiment of a graphical programming environment used to configure a field-programmable gate array (e.g., target FPGA 602) coupled to module hardware 607 (e.g., including an FPGA and peripheral chips). In various embodiments, some of the method elements shown may be performed concurrently, in a different order than shown, or may be omitted. Additional method elements may also be performed as desired. As shown, this method may operate as follows.

At 501, a graphical programming environment may be used to select or specify an operation on a communications packet. For example, operations on a communications packet may include read, write, and configure. Other operations are also contemplated. In some embodiments, the graphical programming environment may include an interface, e.g., a LabVIEW FPGA interface used to program a target FPGA 602. For example, a graphical program may be created that specifies or implements functionality to be performed by the FPGA, wherein the functionality includes communicating via communication packets (e.g., implementation of a communications packet 603). In some embodiments, the graphical program may be created on the computer system 82 (or on a different computer system). The graphical program may be created or assembled by the user arranging a plurality of nodes or icons on a display and then interconnecting the nodes to create the graphical program. In response to the user assembling the graphical program, data structures may be created and stored which represent the graphical program. The nodes may be interconnected in one or more of a data flow, control flow, or execution flow format. The graphical program may thus comprise a plurality of interconnected nodes or icons that visually indicate the functionality of the program. As noted above, the graphical program may comprise a block diagram and may also include a user interface portion or front panel portion. Where the graphical program includes a user interface portion, the user may optionally assemble the user interface on the display. As one example, the user may use the LabVIEW graphical programming development environment to create the graphical program.

In some embodiments, the graphical program may be created by the user creating or specifying a prototype, followed by automatic or programmatic creation of the graphical program from the prototype. This functionality is described in U.S. patent application Ser. No. 09/587,682 titled "System and Method for Automatically Generating a Graphical Program to Perform an Image Processing Algorithm", which is hereby incorporated by reference in its entirety as though fully and completely set forth herein. The graphical program may be created in other manners, either by the user or programmatically, as desired. The graphical program may implement a measurement function that is desired to be performed by the instrument.

At 503, a representation of the communications packet may be translated into hardware. For example, the representation may be translated into hardware in the form of reconfigurable logic inside the target FPGA 602. Other translations and hardware are also contemplated. In some embodiments, the target FPGA 602 may be programmed with the representation from graphical programming code in a graphical program or block diagram in the graphical programming environment.

At 505, the communications packet representation may be serialized. In some embodiments, a custom serial protocol may be used. In some embodiments, the serial protocol may be extensible to multiple channels (e.g., multiple peripheral chips). In some embodiments, information from the communications packet to be serialized may include identifiers, data, and timestamps.

At 507, the serialized communications packet representation may be sent across an interface 609 to module hardware 607. In some embodiments, the communications packet may be received by peripheral interface circuitry 605 (or another form of digital logic) that may include fixed functionality that may not be configurable via target FPGA 602. In some embodiments, the peripheral interface circuitry 605 may be included on the module hardware 607. In some embodiments, the interface 609 may include a collection of shared pins interposed between the graphical programming environment and the module hardware 607, and facilitates communications there between.

At 509, the communications packet representation may be de-serialized.

At 511, the deserialized communications packet may be translated into commands for peripheral chips 611 (e.g., peripheral chips 611a and 611b). In some embodiments, the peripheral chips may include wired or wireless protocol controller chips. In some embodiments, a desired action time may be used with packets to overcome latency of standard data flow path from the host to the peripheral chip. In some embodiments, if the communications are not processed in the desired action time, the system may resend the packet or time out. In some embodiments, a user may select an elemental Controller Area Network (CAN) function such as CAN read, CAN write, or CAN configuration from a LabVIEW FPGA palette and run the virtual instrument (VI). In various embodiments, the VI may generate a bitstream (or net list) that instantiates functionality into the LabVIEW FPGA to allow it to send a particular command (read/write/configuration) across the serial protocol to the peripheral interface circuitry 605 and ultimately to peripheral chips 611 (which may be network chips on a CAN). Other peripheral chips are also contemplated. In some embodiments, an elemental node concept may be generic to any network chip because the node may contain only the general data of a packet (e.g., command type, value of data bytes, etc). In some embodiments, the actual interface to the network chip may be handled inside the peripheral interface circuitry 605. In some embodiments, the peripheral interface circuitry 605 may have the details of the network chip in which it interfaces and, therefore, may abstract details of the network chip from the LabVIEW FPGA through the serial protocol.

In some embodiments, communications may also be implemented from the peripheral chips 611 to the system. For example, communication packets may be sent from the peripheral interface circuitry 605 to the target FPGA 602.

FIG. 7—Flowchart

Figure 7:
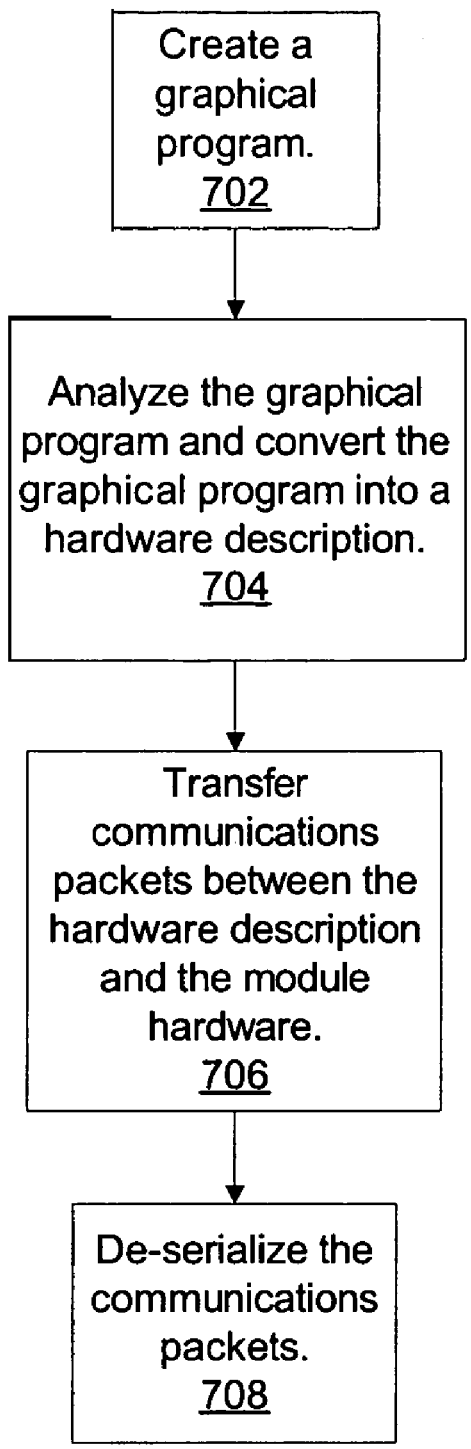
FIG. 7 illustrates an embodiment for transferring a communications packet.

FIG. 7 illustrates an embodiment for transferring a communications packet. As shown, in 702, a user creates a graphical program (e.g., see FIG. 9). As described above, the graphical program comprises a plurality of interconnected nodes or icons that visually indicate functionality of the program. During creation of the graphical program, the user may select a node that performs an operation on a communications packet, such as a read node, a write node, or a node that configures an aspect of the communications packet. For example, a read node may operate to read a communications packet from a device on the network. A write node may be executable to write a communication packet specified in the graphical program to a destination device on the network. A configure node may operate to configure a communications packet, e.g., by setting a bit rate. In some embodiments, the read/write/configure nodes may read, write, and/or configure a communication packet to a CAN.

In 704, a software program may analyze the graphical program created in 702 and may operate to convert the graphical program into a hardware description, e.g., into a net list, and then to a bit file. Thus, in step 704 the software program may effectively convert the graphical program to a form that can be applied to a target programmable hardware element such as an FPGA (e.g., target FPGA 602).

In the case of a write node included in the graphical program in 702, a user may specify a communications packet that is to be written by the write node. This specification of the communications packet may occur in various ways. As one example, the user may create a node, similar to a constant node, which represents or specifies the communications packet. This node may represent a cluster data structure, i.e., a data structure comprising various data types that represent the communications packet. This node that represents or specifies the communications packet may then be wired as an input to the write node that operates to write the communications packet. As another example, the user may select the write node and then enter a location of the communications packet via a dialog box or, e.g., by specifying a file location or URL. Various other mechanisms may be used to specify the communications packet in the diagram. In the case of a read node, the read node may provide as an output a communications packet that may be provided to the one or more other nodes in the diagram, e.g., for storage or further analysis.

In 706, information from the hardware description, e.g., communications packets generated from a graphical program, etc., may be transferred to the module hardware that contains peripheral interface circuitry 605 (e.g., a programmable hardware element such as an FPGA). In some embodiments, information from the hardware description, e.g., command types, data from a net list or bit file generated from a graphical program, etc., may be transferred between the hardware description and the module hardware which contains peripheral interface circuitry 605). In some embodiments, the information sent to the peripheral interface circuitry may be generic to any network chip. In some embodiments, information such as command types and data from the net list or bit file may be serialized and sent across an interface comprising a collection of shared pins between the graphical programming environment system and the module hardware. In some embodiments, the communications packets may be self-sorted in a transmit queue.

In 708, the module hardware may de-serialize the communications packet from the interface and implement the packet onto the peripheral interface circuitry 605. In some embodiments, the module hardware may interpret the communications packet from the serial interface and translate them into specific commands to the peripheral chip. As part of this process, the module hardware de-serializes the read, write and/or configure nodes contained in the diagram as well as any representation of the communications packet contained in the diagram and translates this into commands to the peripheral chips. Thus, the read, write or configure node contained in the graphical program is implemented in the FPGA in the programmable hardware element as commands which instruct the network interface logic (peripheral chips) to perform the various network communications required to accomplish a function represented by the node. For example, if the node is a write node, the programmable hardware element is configured to instruct the network interface logic to perform a write on the network to the appropriate destination device to write the communication packet to the destination device. In the case where the node is a read node, the programmable hardware element is configured to provide commands to the network interface chips to cause the network interface chips to read a communication packet from a source device on the network. In the case of a configuration node, the programmable hardware element is configured to provide commands to the network interface logic or chips to modify a communications packet as specified by the node.

In some embodiments, the peripheral interface circuitry on the module hardware may have fixed functionality that may handle the actual interface to the peripheral chips (e.g., network chips). It may be the responsibility of the module hardware programmable element to know the details of the peripheral chips in which it interfaces. In some embodiments, the communications packet may be timestamped on module hardware as it arrives from a peripheral chip. In some embodiments, multiple hardware modules in the system may be synchronized to allow correlation of the data from each by using shared triggering and timing signals.

Due to the nature of the read, write and configure nodes contained in the graphical program, the graphical program may not be required to be modified regardless of the type of network interface chips or peripheral chips contained in the module hardware. In other words, the present system and method allows the peripheral chips to be independent of the reconfigurable hardware implementation inside the hardware module. In some embodiments, the "personality" of the reconfigurable hardware implementation inside the LabVIEW FPGA may be generated based on the peripheral chip used.

Figure 8:
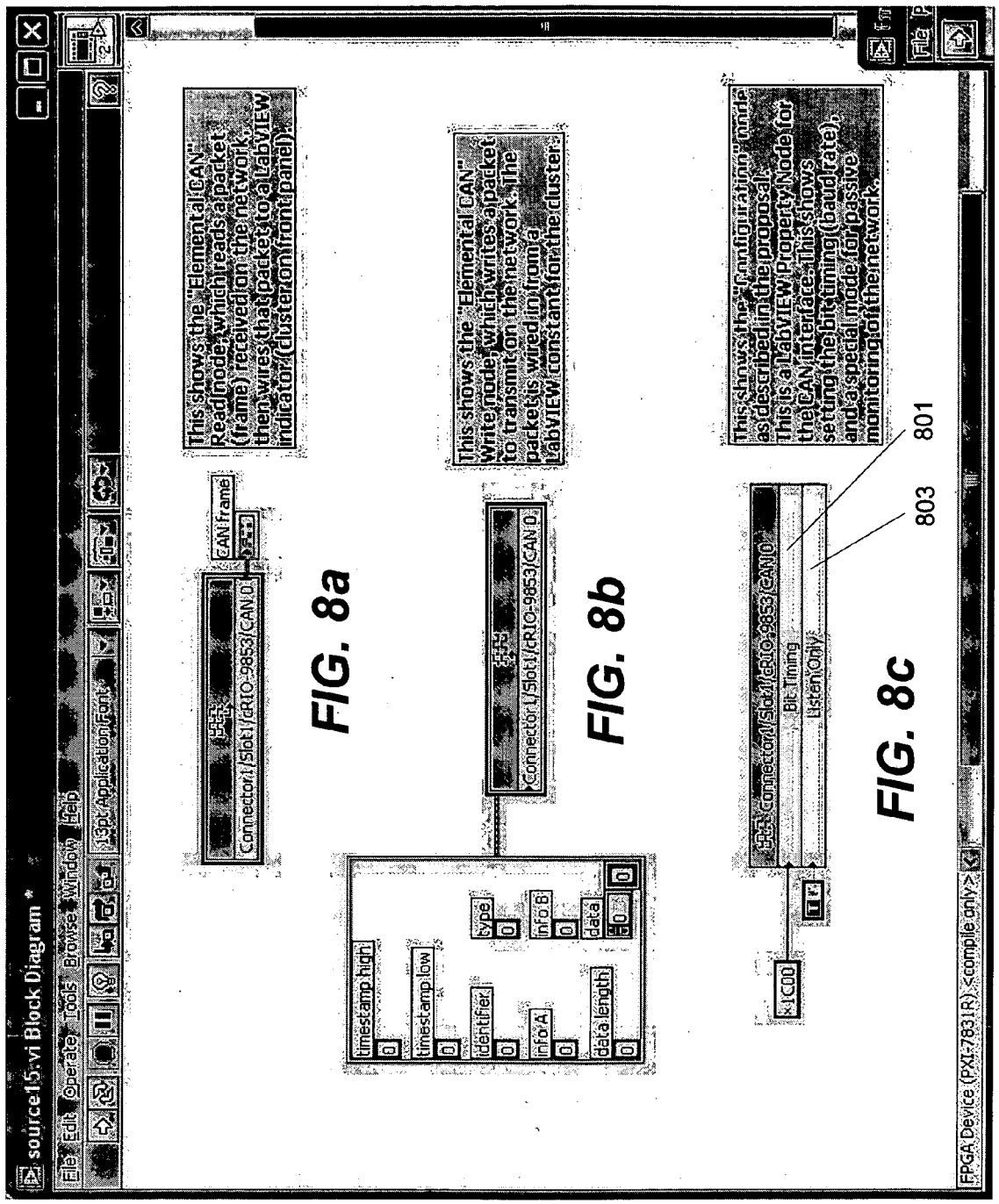
FIGS. 8a, 8b, and 8c illustrate embodiments of graphical user interfaces for read/write/configure nodes.

FIGS. 8a, 8b, and 8c illustrate embodiments of graphical user interfaces for read/write/configure nodes. FIG. 8a illustrates an embodiment of a read node. In some embodiments, the read node may read a packet (e.g., a frame) received on the network and then wire the packet to a graphical program indicator (e.g., a LabVIEW indicator such as a cluster on the front panel). FIG. 8b illustrates an embodiment of a write node that writes a packet to transmit on the network. In some embodiments, the packet may be wired in from a graphical program constant (e.g., a LabVIEW constant) for the cluster. FIG. 8c illustrates an embodiment of a configuration node. For example, a configuration node (such as a LabVIEW property node for a CAN interface) may be used. In some embodiments, a bit timing setting 801 (e.g., the baud rate) and a special mode 803 for passive monitoring of the network may be implemented. Other data, functions and types of nodes are also contemplated.

Figure 9:
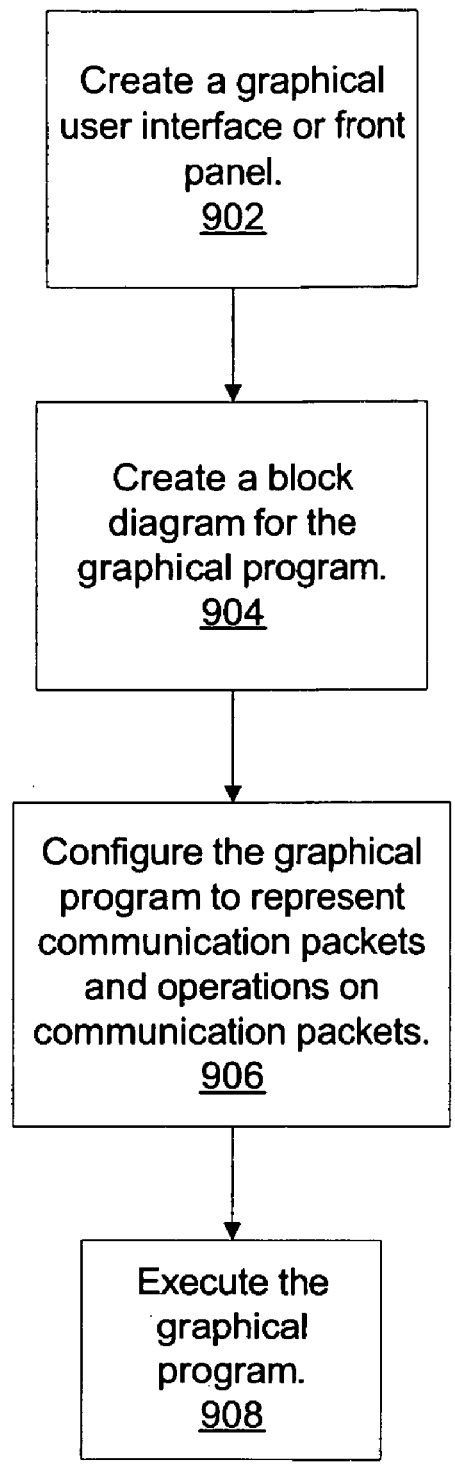
FIG. 9 is a flowchart diagram illustrating an embodiment of a method for creating a graphical program operable to receive and respond to user interface events.

FIG. 9—Creating the Graphical Program

FIG. 9 is a flowchart diagram illustrating an embodiment of a method for creating a graphical program operable to receive and respond to user interface events. It is noted that method elements in the following flowcharts may occur concurrently or in different orders than that shown.

In 902, a graphical user interface or front panel for the graphical program may be created, e.g., in response to user input. The graphical user interface may be created in any of various ways, e.g., depending on the graphical programming development environment used.

In 904, a block diagram for the graphical program may be created. The block diagram may be created in or using any graphical programming development environment, such as LabVIEW, Simulink, VEE, or another graphical programming development environment. The block diagram may be created in response to direct user input, e.g., the user may create the block diagram by placing or "dragging and dropping" icons or nodes on the display and interconnecting the nodes in a desired fashion. Alternatively, the block diagram may be programmatically created from a program specification. The plurality of nodes in the block diagram may be interconnected to visually indicate functionality of the graphical program. The block diagram may have one or more of data flow, control flow, and/or execution flow representations.

It is noted that the graphical user interface and the block diagram may be created separately or together, in various orders, or in an interleaved manner. In some embodiments, the user interface elements in the graphical user interface or front panel may be specified or created, and terminals corresponding to the user interface elements may appear in the block diagram in response. For example, when the user places user interface elements in the graphical user interface or front panel, corresponding terminals may appear in the block diagram as nodes that may be connected to other nodes in the block diagram, e.g., to provide input to and/or display output from other nodes in the block diagram. In another embodiment, the user interface elements may be created in response to the block diagram. For example, the user may create the block diagram, wherein the block diagram includes terminal icons or nodes that indicate respective user interface elements. The graphical user interface or front panel may then be automatically (or manually) created based on the terminal icons or nodes in the block diagram. As another example, the graphical user interface elements may be comprised in the diagram.

In 906, the graphical program may be configured to represent communication packets and operations on communication packets.

In 908, the graphical program may be executed. The graphical program may be executed on any kind of computer system(s) or reconfigurable hardware, as described above.

Controller Area Network (CAN)

In some embodiments, the CAN may include a priority-based network for embedded systems. The network may include embedded processors (e.g., controllers, sensors, actuators, etc.) with an Input/Output (I/O) module for each processor (e.g., to handle analog, digital, Power Management (PWM) signals, etc.). CANs may be used, for example, to network various devices in an automobile; Other uses of CANs are also contemplated (e.g., aircraft, ships, etc.).

Exemplary embodiments for a CAN are described below, however, it is to be understood that the system as described is not restricted to operating with a CAN and may be used with other networks and devices. It is noted that various embodiments may be used for a plethora of applications and is not limited to a CAN. In other words, applications discussed in this description are exemplary only, and various embodiments may be used in any of various types of systems. Thus, various embodiments of these systems and methods are operable to be used in any of various types of applications In some embodiments, CANs may access a database including one or more standard text files to describe a network. For example, a text file with information about an engine temperature may include information including start bit, number of bits, scaling factor, offset, and other unit measurements (e.g., ° C.). CAN systems may be used for testing, among other applications. For example, CANs may be used in solid testing of inter-processor critical communications. The CANs may be used, for example, in conjunction with Peripheral Component Interconnect (PCI), PCI Extensions for Instrumentation (PXI), and Personal Computer Memory Card International Association (PCMCIA) cards. While LABVIEW Realtime (LV RT) may be used to prototype control algorithms, LABVIEW Embedded may be used for embedded processors in a CAN.

In some embodiments, the LabVIEW Field Programmable Gate-Array (LV FPGA) may allow increased user control (for example, see FIGS. 10a and 10b). In some embodiments, a user may define the user application 1001 and the system may define the driver application programming interface (API) 1003, driver 1005, and I/O 1007. In some embodiments, a user may define the user application 1009 and user defined interface 1011 and the system may define the opposing user defined interface 1013, LV FPGA 1015, elemental I/O API 1017, and I/O 1019.

Figure 11:
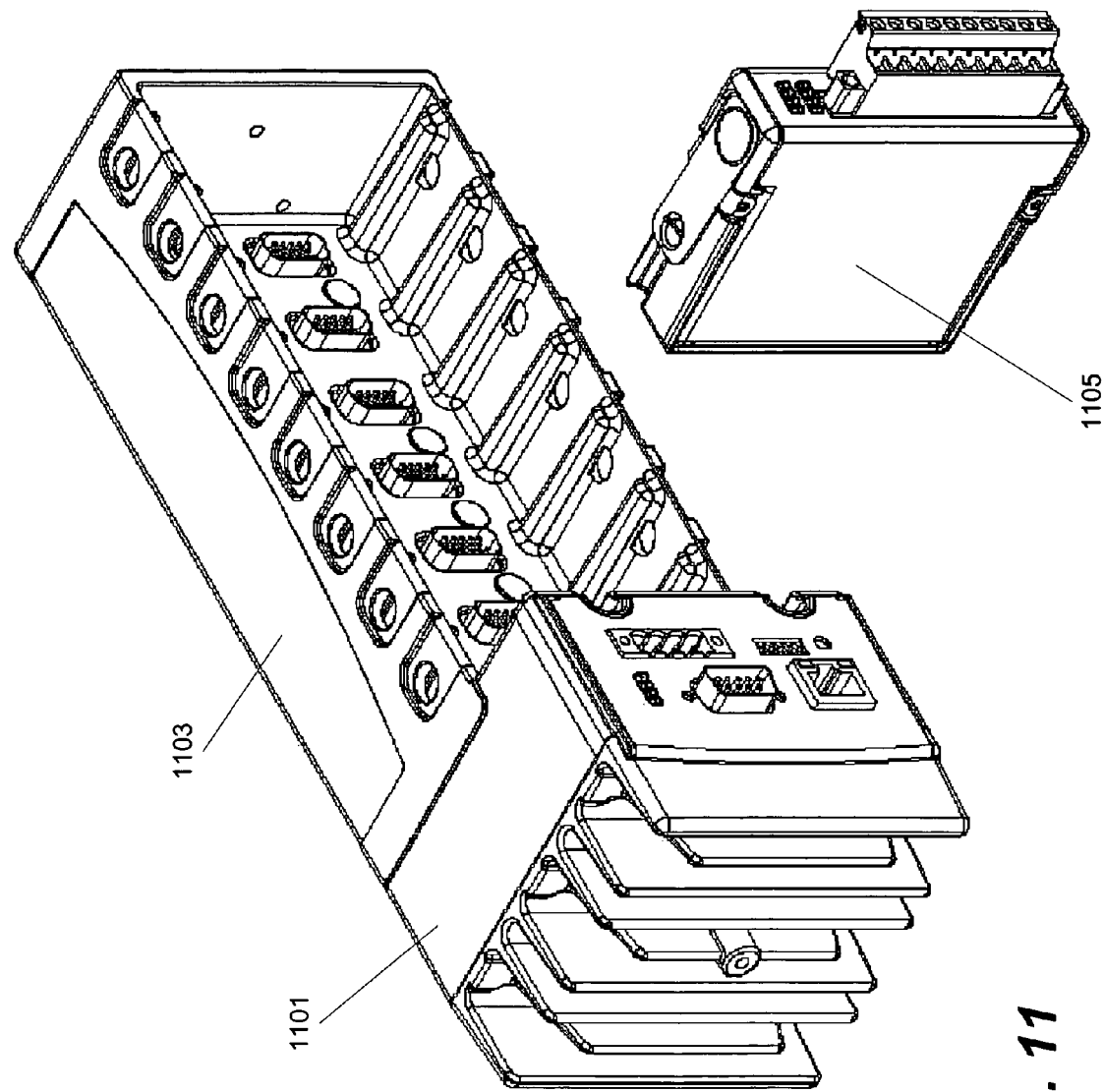
FIG. 11 illustrates an embodiment of a controller, backplane, and I/O module.

As seen in FIG. 11, a controller 1101 (e.g., a LV RT Controller and/or Ethernet 10/100M) may interface with a backplane 1103 (e.g., including a LV FPGA) and I/O Modules 1105 (e.g., AI (Automatic Input), AO (Automatic Output), Data Input-Output (DIO), CAN, and removable storage). The LV FPGA may couple to the AI, AO, DIO, and CAN or may have these elements incorporated. The FPGA may be programmed by a LabVIEW VI program (i.e., written by a user and then written to the FPGA).

Figure 12:
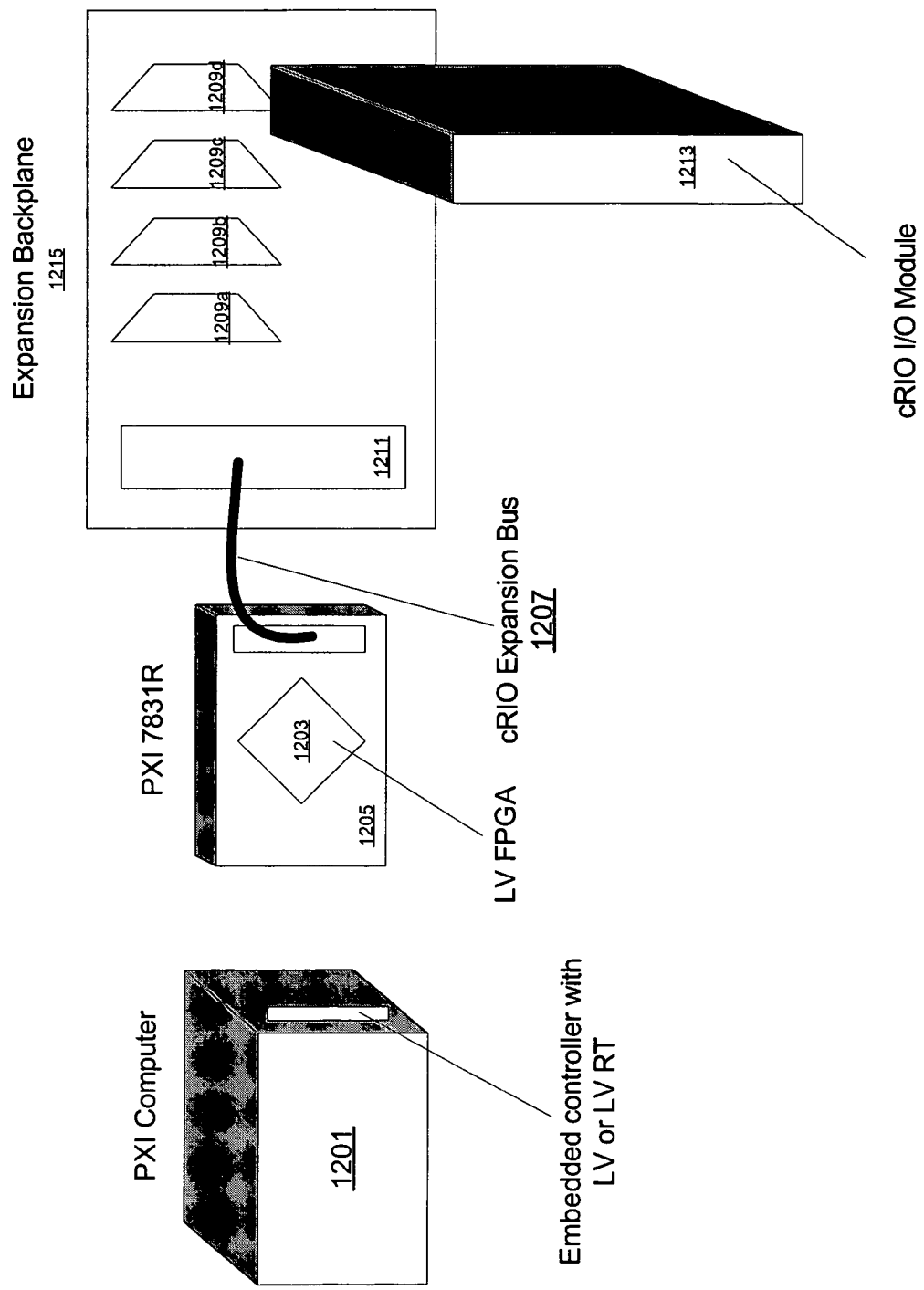
FIG. 12 illustrates an embodiment of a passive and expansion backplanes.

As seen in FIG. 12, in some embodiments, a passive backplane (e.g., a CompactRIO (cRIO) passive backplane) may include a PXI computer 1201 with an embedded controller with LV or LV RT. The PXI computer 1201 may interface with a PXI-7831R 1205 coupled to an expansion backplane 1215 through an expansion bus 1207 (e.g., a cRIO Expansion Bus). An I/O module 1213 (e.g., a cRIO I/O Module) may interface with the expansion backplane 1215. In some embodiments, an active backplane (e.g., for use in automobiles) may include a cRIO active backplane. The active backplane may be used for logging (e.g., during test drives).

Figure 13:
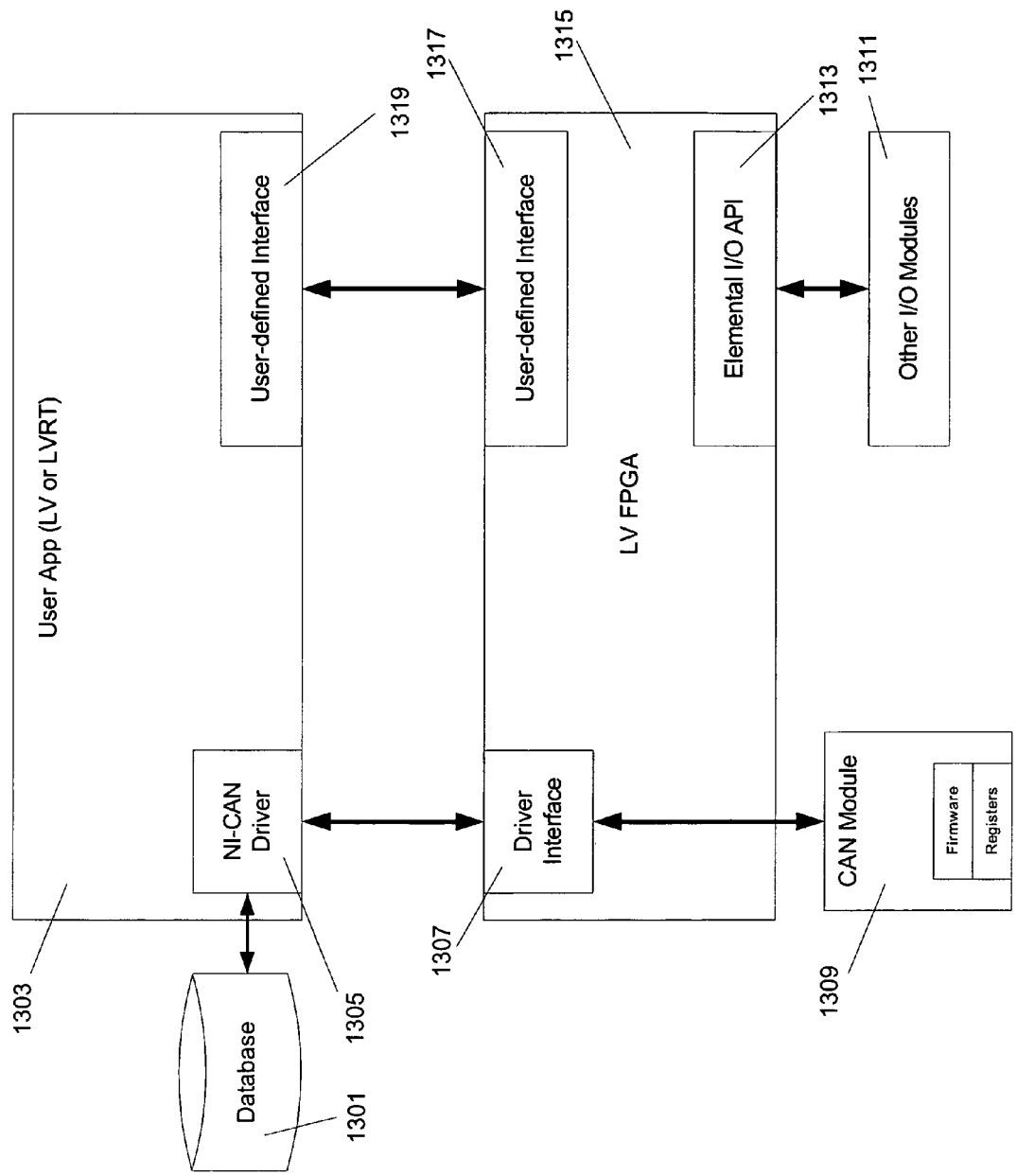
FIG. 13 illustrates an embodiment of a user application and LV FPGA.

As seen in FIG. 13, in various embodiments, a user application 1303 may support an NI-CAN driver communicating with a database 1301. The user application 1303 may couple to a LV FPGA 1315 through a user-defined interface 1319 for the user application 1303 and a user defined interface 1317 on the LV FPGA 1315. The NI-CAN driver 1305 may interact with a driver interface 1307 on the LV FPGA 1315. The driver interface 1307 may interact with a CAN module 1309 (which may include firmware and one or more sets of registers). The LV FPGA 1315 may also include an elemental I/O API 1313 to communicate with other I/O modules 1311. The user application 1303 and LV FPGA 1315 may be user defined while the drivers 1305 and 1307, CAN module 1309, elemental I/O API 1313 and other I/O modules 1311 may be system defined. In some embodiments, the database 1301 may be standards defined.

Figure 14:
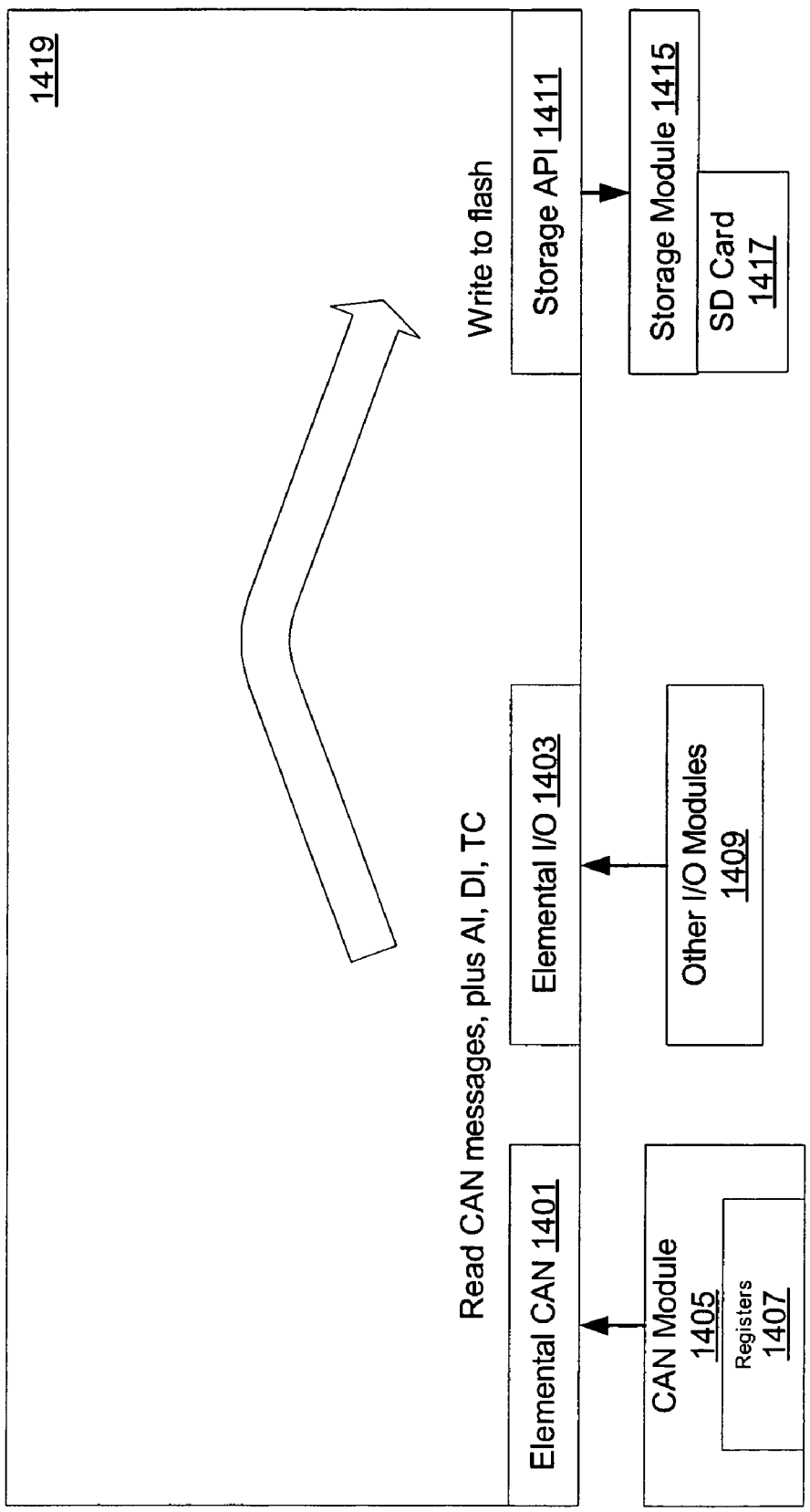
FIG. 14 illustrates an embodiment of a LV FPGA on a cRIO active backplane.

FIG. 14 illustrates an embodiment of a LV FPGA on a cRIO active backplane. In some embodiments, the elemental CAN 1401 may receive signals from the CAN module 1405 (which may include registers 1407). In some embodiments, an elemental I/O 1403 may receive signals from other I/O modules 1409. In some embodiments, after the elemental I/O receives information from the other I/O modules, READ messages (including AI, DI, and TC) may be read and written to the flash. As part of the flash, storage API 1411 may write to the storage module 1415 coupled to a secure digital (SD) card 1417.

Figure 15:
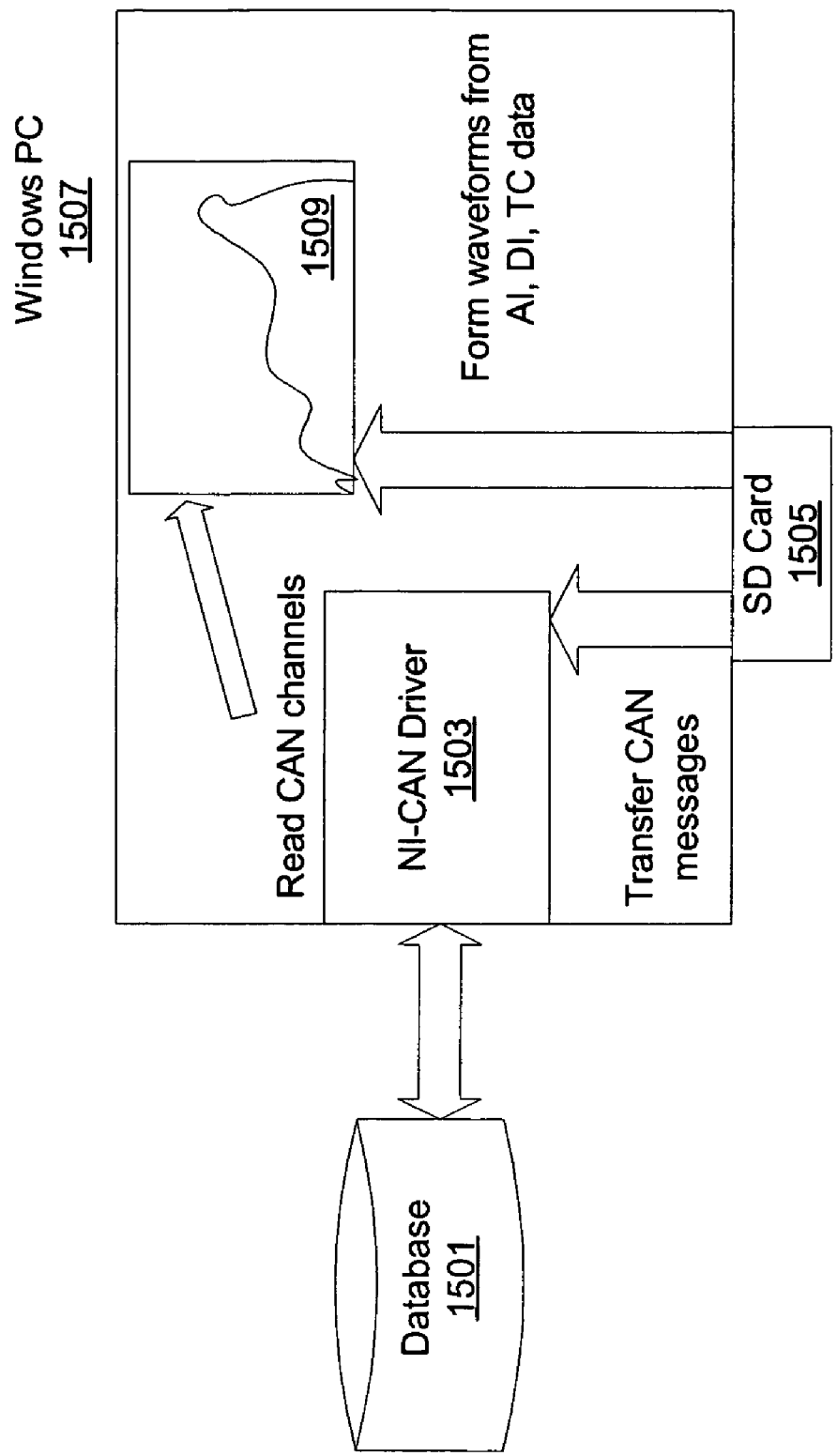
FIG. 15 illustrates an embodiment of a database and Windows PC.

FIG. 15 illustrates an embodiment of a system for logging on a Windows PC 1507. In some embodiments, a database 1501 may be accessed by an NI-CAN driver 1503 which may also access an SD card 1505. CAN messages may be transferred from the SD card 1505. A windows PC 1507 may read the CAN channels and use the data. For example, the data may be plotted 1509. In addition, the Windows PC may access the data on the SD card (e.g., by forming waveforms from AI, DI, and TC data).

Figure 16:
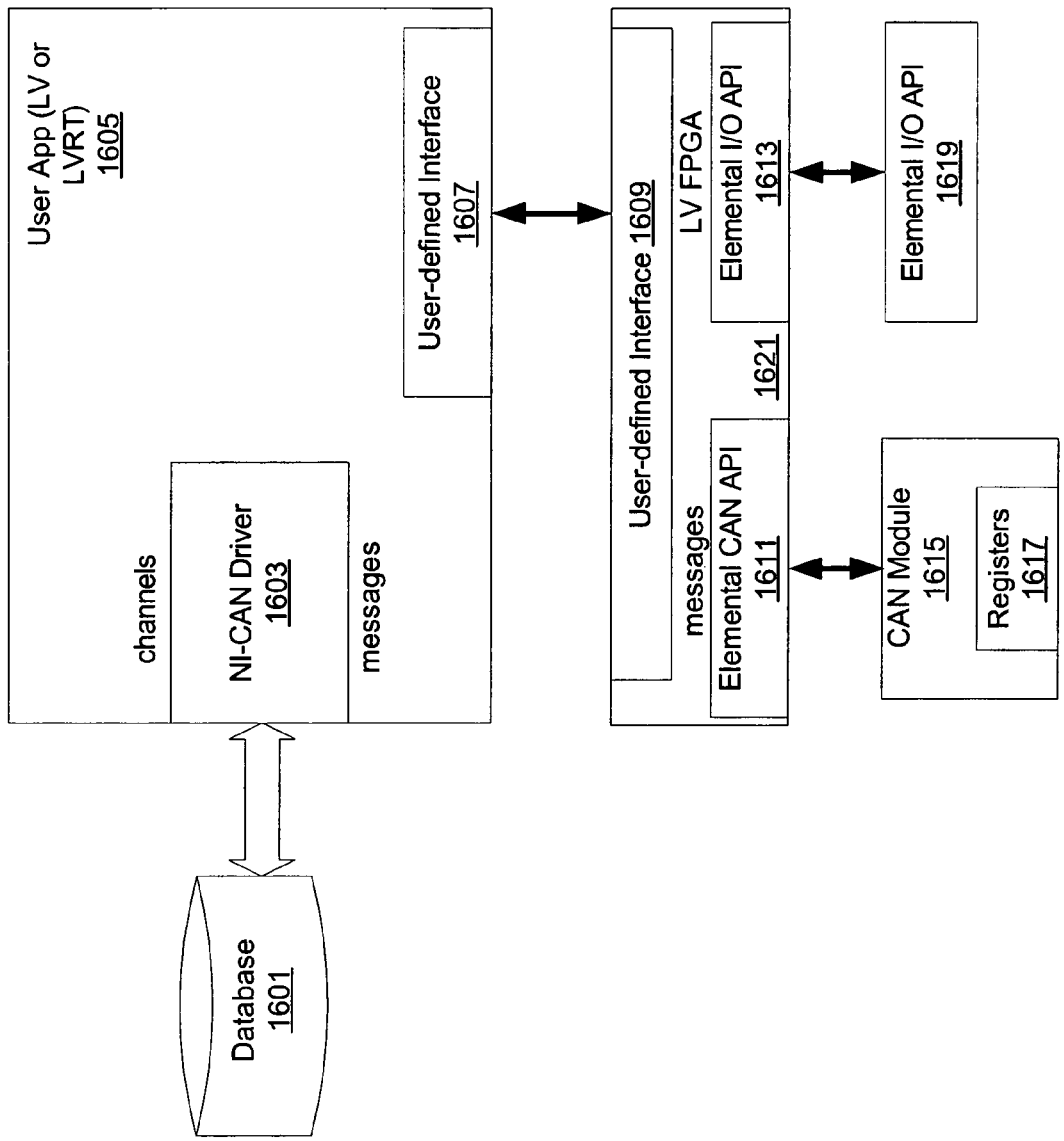
FIG. 16 illustrates an embodiment of a user application and LV FPGA with elemental CAN API and elemental I/O API.

FIG. 16 illustrates an embodiment of a system for accessing an LV FPGA with a user application 1605. The NI CAN Driver 1603 may access the database 1601. In some embodiments, the user application 1605 may interact with the NI CAN Driver 1603 through channels and messages. The user application 1605 may include a user-defined interface 1607. The LV FPGA 1621 may include an elemental CAN API 1611 which accesses a CAN module 1615. The CAN module may include registers 1617. The LV FPGA 1621 may also include an elemental I/O API 1613 which may communicate with other I/O modules 1619. In some embodiments, an LV Embedded may be used (the elemental CAN 1611 may be included in the LV Embedded).

In various embodiments, the CAN registers (e.g., register 1617) may include common features such as bit timing registers, the ability to receive and transmit messages, and may have a communication state. The registers may also have ID filters, use message objects (e.g., slots to handle single ID), timestamping, receiving FIFO, and special modes (including listen only and single shot transmit).

In some embodiments, the elemental API may be portable, and include features which are placed in target specific dialogs during configuration time and placed in the API during run time (documents may remain target-specific). In some embodiments, the elemental CAN may include embodiments to read, frame, and time related embodiments. The elemental CAN may select an FPGA Device I/O and possibly change I/O type to digital input port.

In some embodiments, the LV FPGA may be used for module communication. A cRIO may define several (e.g., 10) digital lines. Parallel signals may be used for common DIO implementation and SPI signals to ADC may be used for common AI implementation. In some embodiments, multiple (e.g., 2) CAN ports may be used per module with 20,000 messages/sec per port (50 μs each). Each message may be 24 bytes, and be sent at approximately 1 M byte/sec (to receive, transmit, or a mix of receiving and transmitting). Other speeds and messages sizes may also be used.

Figure 17:
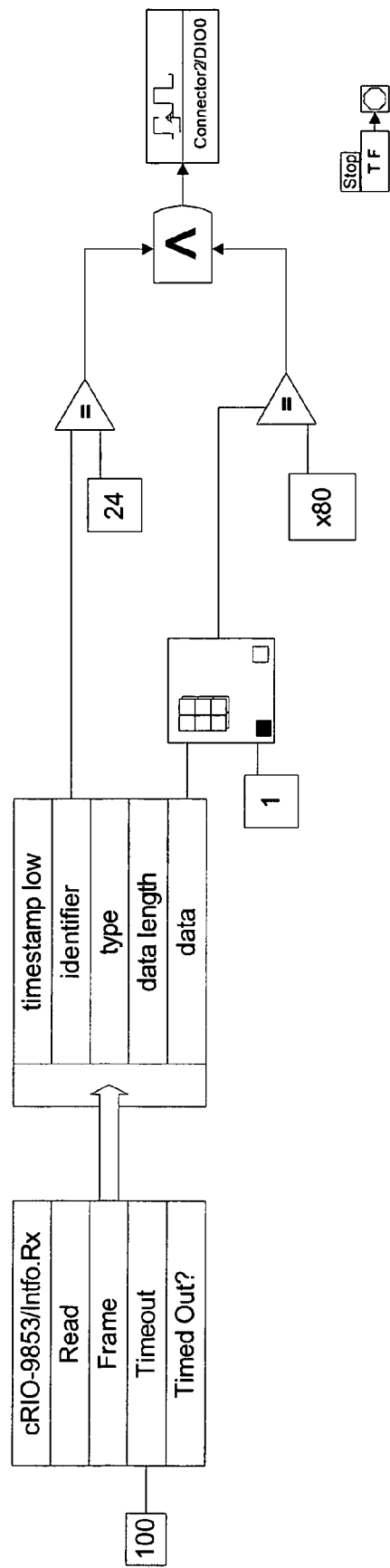
FIG. 17 illustrates an embodiment of graphical programming for identifier comparisons.

FIG. 17 illustrates an embodiment of graphical programming for comparing an identifier and examining data (e.g., determining if data[1]=x80). If the conditions are met, DO line high is set high (i.e., triggered).

Figure 18:
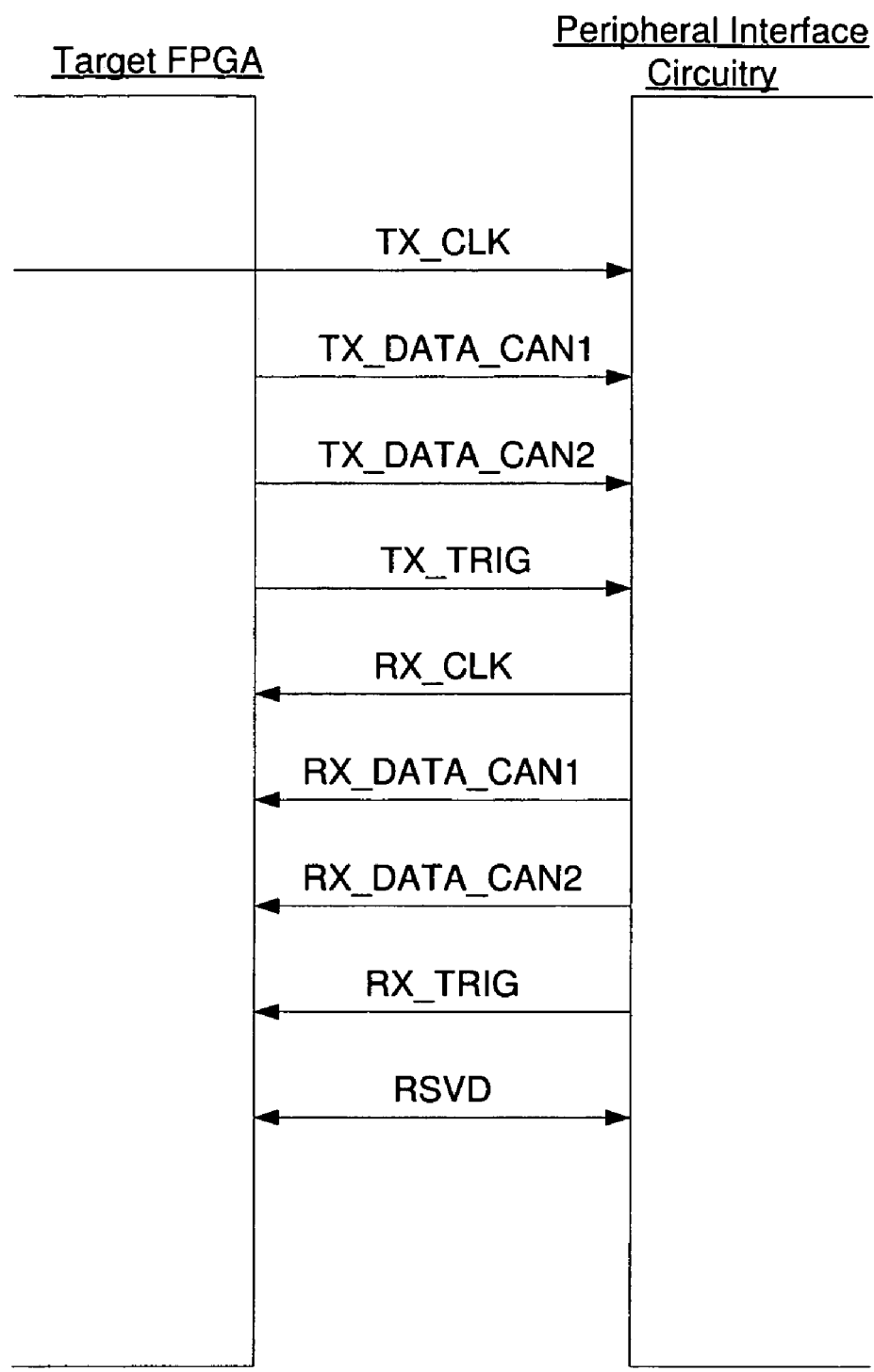
FIG. 18 illustrates an embodiment of signal lines between a target FPGA and peripheral interface circuitry.

FIG. 18 illustrates various signals between a target FPGA (e.g., a LV-FPGA) and peripheral interface circuitry (e.g., cRIO-CAN). In some embodiments, the signals from the LV-FPGA to the cRIO-CAN may include TX_CLK, TX_DATA_CAN1, TX_DATA_CAN2, and TX_TRIG (other names and naming conventions may be used). In some embodiments, the signals from the cRIO-CAN to the LV-FPGA may include RX_CLK, RX_DATA_CAN1, RX_DATA_CAN2, and RX_TRIG. Other signals may also be used. In some embodiments, lines may be reserved. In some embodiments, a separate line may be used for each port and each direction. The latency for a CAN message may be 40 MHz (approximately 5 μs). In some embodiments, the latency for a CAN message may be 10 MHz (approximately 20 μs). In some embodiments, jitter of approximately 100 ns may occur if runtime loop is limited to read/write. Other latencies and jitters may also be used. In some embodiments, a packet between the LV-FPGA and cRIO-CAN may use CRC for error detection (e.g., noise on a passive cable).

Figure 19:
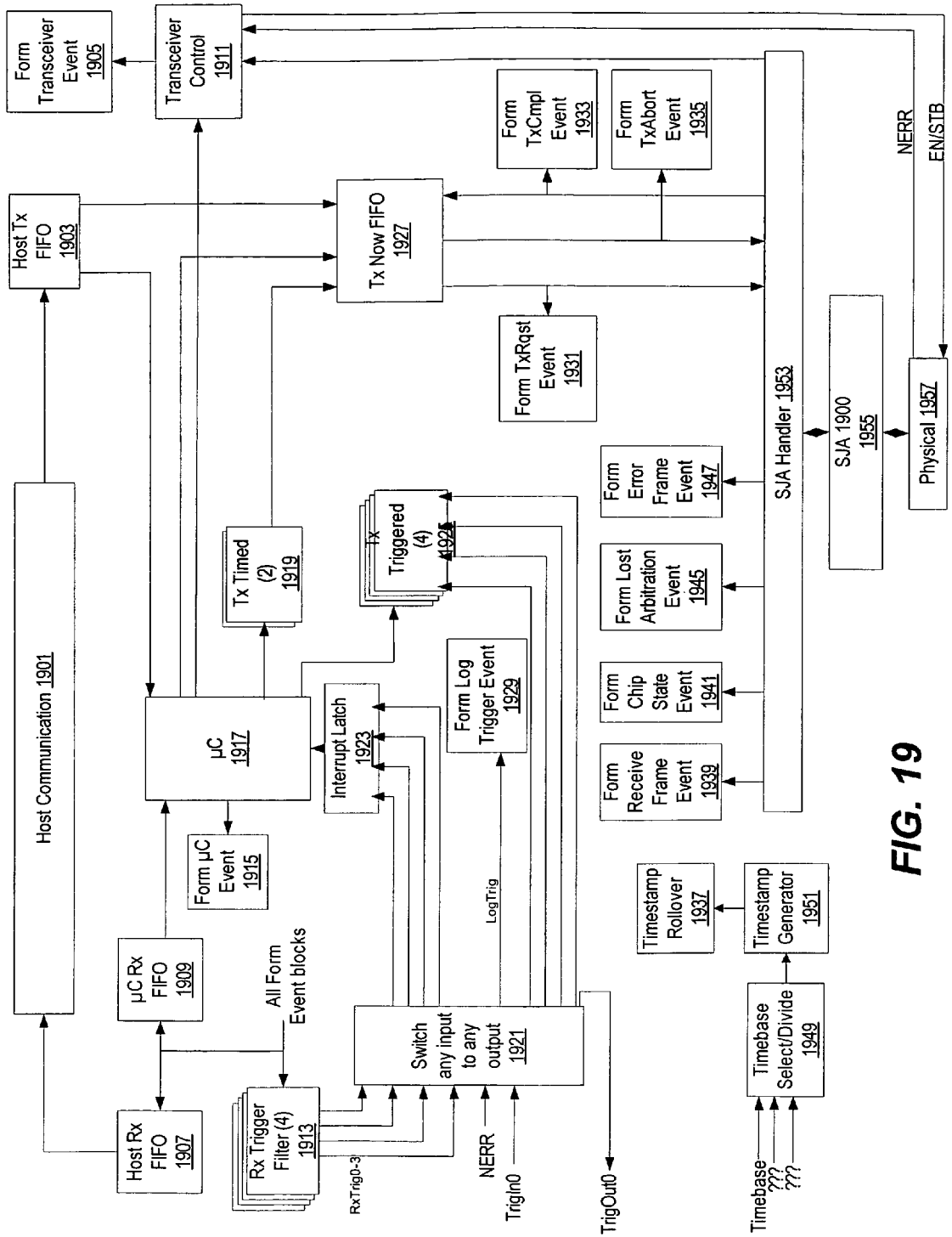
FIG. 19 illustrates an embodiment of a CAN system.

As seen in FIG. 19, the CAN system may include several components. In some embodiments, host communication 1901 may include communication of events to/from the host driver. For cRIO, this may include a protocol implemented alongside the LV FPGA VI for CAN. The Host Tx FIFO 1903 may handle events from the host, including threshold interrupts back to the host. Transmit (Tx) event may include routing information (μC or Tx Now). If destination is Tx Now, and the Tx Now FIFO 1927 is not full, the event may bypass this FIFO and go directly to the Tx Now FIFO 1927. Therefore, this FIFO's primary purpose may be queueing for the μC 1917.

In some embodiments, the μC 1917 may be a microcontroller that handles complex data structures (e.g., queues, tables, and lists), especially for timed transmit. It may also be used for triggered transmit when FPGA resources run out. The Form μC Event 1915 may register for the microcontroller to send events back to the host driver, such as to respond to various functions. It may have the ability to form an event at the head of the Host Rx FIFO (bypass frames), and also to interrupt the driver regardless of events pending. The μC Rx FIFO 1909 may handle events to the μC, such as to handle remote frames when Rx Trigger Filters 1913 are all used (e.g., 19 deep). It may include a filter such as Host Rx FIFO 1907.

In some embodiments, the Host Rx FIFO 1907 may handle events to the host, including thresholds (probably 80-190 deep). It may include a filter with a mask for event type/flags, ID, and possibly data. The Rx Trigger Filter 1913 may check receive (Rx) events (filter like Host Rx FIFO 1907), and when a match occurs, pulses an internal RxTrig signal (which may include multiple buffers (e.g., 4)). Connecting an RxTrig signal to a TxTrig signal may enable a remote response. The Switch any input to any output 1921 and may register for μC 1917 to switch any input signal to any output signal. The Switch 1921 may be limited if needed (e.g., NERR switched to only TrigOut0 or LogTrig). Switch 1921 may also provide registers for μC 1917 to write to TrigOut0 (μCIntr (start/stop trigger) and NERR).

In some embodiments, the Interrupt Latch 1923 may be used by the μC 1917 which may require internal signals from the switch to be latched. FIFOs may integrate their own latching. The Form Log Trigger Event 1929 may log signal pulses (or level changes) to Rx FIFO that may be used with TrigIn0 (Real Time System Integration (RTSI) input). The Tx Triggered 1925 may be used by μC 1917 to write a frame or to be transferred to Tx Now 1927 when an internal TxTrig signal pulses. The Tx Triggered 1925 may have multiple buffers (e.g., 4) including CPU Update flag for mutual exclusion (mutex) and done interrupt to μC 1917 for each buffer.

In some embodiments, the Tx Timed 1919 may be used by μC 1917 to write a frame with 32-bit time to be transferred to Tx Now 1927. The Tx Timed 1919 may include multiple buffers (e.g., 2) including CPU Update flag for mutex and done interrupt to μC for each buffer. The Tx Now FIFO 1927 may be a FIFO of CAN frames to be transmitted immediately (e.g., without using a timer). FIFO may be sorted by an arbitration ID which may include the use of an SJA abort. The FIFO may include a programmable frame gap in μs. For μC writes, registers may provide a CPU Update flag for mutex.

In some embodiments, the Form TxRqst Event 1931 may form an event (if enabled) when Tx Now FIFO 1927 submits a frame to the SJA. The Form TxCmpl Event 1933 may form an event (if enabled) when SJA interrupt indicates a successful transmit. In some embodiments, the Form TxAbort Event 1935 may form an event (if enabled) when Tx Now FIFO 1927 successfully aborts transmit in the SJA (ID re-prioritization). The SJA Handler 1953 may handle interrupts from SJA to form events. The Handler 1953 may also provide pass-through register access for SJA setup/start/stop from μC 1917.

In some embodiments, the Form Receive Frame Event 1939 may handle receive interrupt, read data/remote frame from SJA Rx FIFO, and timestamp for event (including an accurate timestamp). The Form Chip State Event 1941 may interrupt a change in controller state (Bus Off, Err Passive, Err Active, Err Warn). If enabled, it may form a timestamped event. The Form Lost Arbitration Event 1945 may interrupt to indicate each lost arbitration. If enabled, it may form a timestamped event.

In some embodiments, the Form Error Frame Event 1947 may interrupt to indicate each frame attempt, including error frames. If enabled, it may form a timestamped event. The SJA_1900 1955 may include a Philips SJA 1900 CAN Controller. The Physical 1957 may include a CAN transceiver (high-speed (HS), low-speed (LS), or single wire (SW)). The Transceiver Control 1911 may register for µC 1917 to read and control transceiver signals. It may handle a wakeup from SJA automatically (e.g., not in µC). The Form Transceiver Event 1905, if enabled, may log Rx (receive) event for changes in NERR (a pin on the CAN transceiver indicating bus fault) or Enable/Standby (EN/STB) (transceiver mode).

In some embodiments, the Timebase Select/Divide 1949 may select timebase, and divide down to common rate (1 MHz or 19 MHz). The Timestamp Generator 1951 may maintain 32-bit timestamp, readable from any block. It may be used to timestamp events and Tx Timed blocks. The Timestamp Rollover 1937 may be used to include a 32-bit counter of the number of times the timestamp has rolled (0xFFFFFFFF to 0x00000000).

cRIO CAN API Specification

In some embodiments, inputs and outputs (e.g., included in clusters and/or frames) may be used throughout the CAN. Several examples are provided, however, it is to be understood that other names, naming conventions, variable types, properties, etc. may be used. In addition, size conventions (e.g., U8—unsigned 8 bit, U32—unsigned 32 bit, I32—integer 32 bit, etc.) are used throughout, however, it is to be understood that other sizes are also contemplated.

In some embodiments, the API for the CAN module (cRIO-9853) may be provided through the FPGA Device I/O palette. Some FPGA Device I/O functions that may apply to the CAN module include reading a CAN frame for the Digital Port Input, writing a CAN frame for a Digital Port Output, Start, Stop, Reset, or Abort Transmit for an I/O Method Node, and get or set various properties for the I/O Property Node. In addition, the Configure Target for cRIO tool may enable the user to specify configuration properties such as baud rate.

In some embodiments, configuring the target for cRIO may include a configuration tool to be launched from multiple locations in LabVIEW, including the Embedded Project Manager (Hardware menu), and the cRIO Configuration tab of FPGA Device I/O nodes.

In some embodiments, the discovery modules may include Discover Modules buttons to download a special. LV FPGA image that uses a standard protocol to query identification properties from each module. The modules may conform to this protocol, so this button may cause the CAN module to be detected automatically. If the user does not use Discover Modules (i.e. already running a LV FPGA image), the user may define each cRIO module manually within the tool. This may be done with the module number (e.g., cRIO-9853).

In some embodiments, once the CAN cRIO module is selected, the Module Configuration tab may provide the common configuration properties for CAN. When configuration properties are specified within the tool, they may be downloaded to the module when the user VI runs. These properties may be saved as part of the LV Embedded project file as well as the FPGA image.

The Module Configuration may allow a user to avoid setting properties in the VI, and focus on I/O (Read/Write) within the LV FPGA diagram. The following properties may be provided for each CAN port on the module. For 2-port CAN modules, a tabbed control may be provided to duplicate the properties.

In some embodiments, as with NI-CAN, the basic baud rates may be listed in a ring. The default baud rate may be 500 k, (i.e., the baud rate used for many high-speed transceivers). In some embodiments, the baud rate may be stored in the LV Embedded project only. The FPGA image may use the BTR values exclusively.

A boolean control may indicate whether to call the Start method automatically when the VI runs. The default may be True. The start method may provide a list of use cases for setting this property to False. In some embodiments, a boolean control may also be used to indicate whether to enable a Listen Only feature for passive monitoring of the network. The default may be False.

A button may be provided to open a sub dialog to configure more advanced properties. In some embodiments, space may be limited within the cRIO dialog itself. In some embodiments, the cRIO dialog may have more space. In some embodiments, a separate dialog may be used for more advanced properties. The dialog may provide a checkbox called Specify Baud Rate as Bit Timing Registers, and two integer controls (hexadecimal) for BTR0 and BTR1. The default for Specify may be False, which may indicate that the basic Baud Rate ring applies (BTR0/1 dimmed). When Specify may be True, the BTR values may apply, and the basic Baud Rate ring may be dimmed. Other properties for this Advanced dialog may include a Filter Mode, Filter Mask, Filter Comparator, Comm Warning Threshold, and Log properties (like Log Transmit Success). A property that may be set prior to start may be helpful in this dialog.

The Digital Port Input (Read) may wait for a CAN frame to be received, then return that frame as a cluster. It may not be valid to invoke Read prior to Start.

In some embodiments, a properties dialog may include a general tab for Terminal. In some embodiments, the tab may contain a control including the Terminal to Read from. This ring may list all terminals for DIO, which includes CAN. Each Terminal name may use the syntax: <Module Name>/<Channel Name>. <Module Name> may be the name of the module that the user specified in the Configure Target tool (such as "Connector1/Slot1/cRIO-9853/"). For Channel Names, cRIO CAN may reference each physical CAN port on the module (e.g., "P0" for the first CAN port on the module and "P1" for the second CAN port on the module.) This may be similar to DIO, in that both Read and Write can be used on the same channel name. The 'P' stands for port. Since the Terminal Name may be often listed in the icon for the VI, a short notation (instead of "Port0") may be used to abbreviate. This may be similar to AI and DI conventions.

In some embodiments, the arbitration tab may be used for cRIO (e.g., used for properties relating to resource contention). Selections of "None", "Normal", and "Normal (Optimize for Single Accessor)" may be used. In some embodiments, a cRIO Configuration tab may provide a dialog with a button to launch the Configure Target tool. It also displays the current properties in a read-only form, including CAN-specific properties such as baud rate. In some embodiments, a CAN Configuration tab may include Timeout. The DIO Port infrastructure may support addition of a module-specific tab in the Input and Output node (but may not support Method or Property node). Since both CAN Read and CAN Write may block, the user may specify a Timeout value. The Timeout may be a designated number of milliseconds. In some embodiments, ticks or microsecond resolution may be used.

Special values of 0 (do not wait) and −1 (wait indefinitely) may be used. The Timeout value may be different for each Read and Write node on the diagram. In some embodiments, a Timeout may be provided that applies to all Read and Write nodes, which may be exposed in the I/O Property Node only. In some embodiments, an Add Input button may allow a user to add more than one CAN port to the Read, and also add actual DIO to the same Read. This feature may operate properly, but each CAN Read may be blocking (i.e., waits for frame received).

In some embodiments, diagram inputs may be enabled in a context menu using the Error Terminals selection. In some embodiments, diagram outputs may be enabled in a context menu using the Error Terminals selection. As for other FPGA I/O functions, this may provide a simplified error cluster to report a handful of errors. The underlying FPGA code may not be burdened with complex error checks. In some embodiments, an error code of Timeout may occur for a Read (e.g., the Timeout value may expire before frame was received). When a timeout occurs, the frame from the previous Read may return. In some embodiments, an error code of Not Started may indicate a port may not be running. In some embodiments, an error code of overrun may indicate one or more frames has been lost or an error code of "New frame replaced old frame" may indicate an error is unlikely.

In some embodiments, a CAN Frame Cluster may include a single CAN frame to be represented as a cluster. With regard to NI-CAN's frame/channel conversion feature, both typedefs may be used to support using Poly VIs or similar.

In some embodiments, a Timestamp of when the frame was received may be included (e.g., elements of the cluster may include Timestamp High and Timestamp Low). The timestamp format may be the same as NI-CAN's C/C++ API, and it may correspond to Win32/.NET FILETIME. The high and low may represent a single count. The timestamp may be zero-based or may be UTC (coordinated universal time) based. The time may start ticking when communication starts. In some embodiments, the resolution may be 100 ns (same as FILETIME).

In some embodiments, identifier (arbitration ID) may be a U32 ID using the same format as NI-CAN, in which bit mask 0x20000000 set indicates an extended (29-bit) ID, and cleared may indicate a standard ID. Other sizes are also contemplated. Type (U8) may include a type of frame with Data Frame 0, Remote Frame 1, Comm Info 2, and Transceiver Info 3.

InfoA (U8) may include information that qualifies a basic Type. This may be zero by default. It may describe a logged event (e.g., see Log Transmit Success if the cRIO CAN is implemented with special logging properties. In some embodiments, InfoB (U8) may include information that qualifies the basic Type.

In some embodiments, Data Length (U8) may include information for data frames, including indicating the number of bytes in Data (e.g., 0-8). For remote frames, this may indicate the number of bytes requested. In some embodiments, unsigned 8 bit (U8) Data may, for data frames, provide the data bytes (fixed size of 8). Other sizes are also contemplated.

In some embodiments, Digital Port Output (Write) may wait for an available transmit entry, then write a frame to request transmit. The single frame for transmit may be provided in a cluster. This VI may not wait for the requested transmit to complete on the network (acknowledgement). This may be determined by querying the Transmit Complete property (using Wait or Get). The behavior of this Write with regard to waiting for an available transmit entry may depend on the value of the Transmit FIFO Enable property. In some embodiments, it may be valid to invoke Write prior to Start, in which case Start may begin the transmit.

In some embodiments, the Properties Dialog may include a dialog that may be the same as Digital Port Input (Read). If the Timeout may be provided in the dialog, it may specify a distinct value for each Write node.

In some embodiments, Diagram Inputs may be enabled in context menu using the Error Terminals selection. In some embodiments, CAN Frame Cluster may include a frame represented as a cluster (same as Read). The cluster may include a timestamp high and a timestamp low (each may, for example, be U32—other sizes and cluster variables are also contemplated). In some embodiments, the timestamp may be ignored. The transmit request may occur as soon as possible (e.g., it may not be timed). The Diagram Inputs may pass an error cluster.

In some embodiments, Diagram Outputs may be enabled in context menu using the Error Terminals selection. For Write, the Timeout error code may indicate previous transmit did not complete before the Timeout expired. In some embodiments, this may indicate that a new transmit request may not be completed. Diagram Outputs may also pass an error cluster.

In some embodiments, an I/O Method Node may include "Wait" for a subset of the boolean properties, this may provide a method to Wait (block) for a change from false to true. For cRIO, this method may be integrated into the existing Wait method for the Digital Line I/O Type. The spec below assumes that we may implement Wait as a CAN-specific method. In some embodiments, a Configure Dialog may include tabs of a subset of the Properties dialog for Read. In some embodiments, Diagram Inputs may be enabled in context menu using the Error Terminals selection. In some embodiments, Condition (U8) may include an enumeration to indicate the condition to wait for including Transmit Complete to wait for returns when the Transmit Complete property changes from False to True, the Comm State Change to wait returns when the Comm State Change property changes from False to True, and the Transceiver Wakeup to wait returns when the Transceiver Mode property changes from Sleep to Normal mode. This may occur due to a remote wakeup (received frame). In some embodiments, conditions may not require Receive Available or Transmit Available, because the Read and Write nodes may implicitly wait for those properties. If the user wants to use Read and Write in a non-blocking manner, the user may Get those properties before calling Read/Write. In some embodiments, Timeout (I32) may include a resolution in milliseconds (like Read/Write). In some embodiments, special values of 0 (do not wait) and −1 (wait indefinitely) may be used. In some embodiments, Diagram Outputs may be enable in context menu using the Error Terminals selection. Timed Out (provided as True/False (TF)) may indicate a timeout.

In some embodiments, Start may include a Start communication to use in cases (as opposed to Auto Start in the Module Configuration) such as change configuration properties within the diagram (such as Listen Only), Auto-baud algorithms (must Stop/Start to Set baud rate in diagram), Automatic recovery from Bus Off state (must re-Start), and Start CAN communication on a trigger (AI or DI).

In some embodiments, Configure Dialog may include tabs for a subset of the Properties dialog for Read. In some embodiments, Diagram Inputs may be enabled in a context menu using the Error Terminals selection. In some embodiments, Diagram Outputs may be enabled in context menu using the Error Terminals selection.

In some embodiments, Stop may stop communication. In some embodiments, Configure Dialog may include tabs for a subset of the Properties dialog for Read. In some embodiments, Diagram Inputs may be enabled in a context menu using the Error Terminals selection.

In some embodiments, Diagram Outputs may be enabled in context menu using the Error Terminals selection.

In some embodiments, Reset may be used. When a CAN controller enters the Bus Off state (see Comm State property), it may not communicate. For many CAN controllers, one way to fully recover from the Bus Off state may be 1) power cycle, or 2) pulse a reset pin from processor to CAN controller. In other words, most CAN controllers do not allow recovery from Bus Off to Error Active using the CAN controller register set. This behavior may be normal within an embedded system (vehicle), but many test setups intentionally generate Bus Off, and therefore may require a mechanism to recover (i.e., to run the test again). In some embodiments, the method may toggle a reset pin to the CAN controller, then re-initialize the registers to a default configuration (i.e. when LabVIEW Run first occurred). This method may also re-initialize the state machine for communication between LV FPGA and the module (in case an error occurs there).

In some embodiments, Configure Dialog may include tabs for a subset of the Properties dialog for Read. In some embodiments, Diagram Inputs may include an error cluster. This may be enabled in context menu using the Error Terminals selection.

In some embodiments, Diagram Outputs may be enabled in a context menu using the Error Terminals selection. In some embodiments, Abort Transmit may be used. Since the determinism of CAN may depend on the prioritization of frames based on ID, many CAN controllers provide the capability to abort a pending transmit in order to replace it with a higher priority ID. This may be really more of a method (action to perform) than a property. After invoking this method, the user may Wait for Transmit Complete, then Get the Transmit Success property to determine if the abort was too late (already transmitted successfully). This method may be used when the Transmit FIFO Enable property is False.

In some embodiments, Configure Dialog may include tabs that are a subset of the Properties dialog for Read. In some embodiments, Diagram Inputs may be enabled in the context menu using the Error Terminals selection. In some embodiments, Diagram Outputs may be enabled in the context menu using the Error Terminals selection.

In some embodiments, for Abort Transmit, the following error codes may include Transmit FIFO Enabled. If this property is True, the Abort Transmit may not be used. In some embodiments, I/O Property Node (Get/Set) may include an initial Overview section to describe the I/O Property Node itself, and subsequent sections describe each property. In some embodiments, the permissions for each property may use "Get" for retrieving the property, "Set" for setting the property, "Stopped" for setting the property prior to Start, and "Running" for setting the property after Start. For example, a property with Permissions of "Get/Set, Stopped" means that a user can Get the property at any time, but the user may Set the property prior to Start. The properties may be listed in alphabetical order.

In some embodiments, Configure Dialog may include tabs for a subset of the Properties dialog for Read. In some embodiments, Diagram Inputs may include one or more properties selected for Set access enabled in context menu using the Error Terminals selection. In some embodiments, Diagram Outputs may include one or more properties selected for Get access enabled in context menu using the Error Terminals selection. In some embodiments, Bit Timing may be included. In some embodiments, each CAN baud rate may correspond to multiple values for two Bit Timing Registers. The bit fields in these registers may be consistent across almost all CAN controllers. This property may specify the baud rate as values for the Bit Timing Registers. The low byte may be BTR0, and the high byte may be BTR1. In some embodiments, the default value for this property may come from the Configure Target tool. The basic baud rate property may be converted to commonly used BTR values, or the user may specify BTR values directly in the Advanced dialog. In order to optimize use of LV FPGA gates, this property may not support the higher-level baud rate convention. If a user needs to specify the baud rate within a diagram, the user may obtain a common BTR conversion using the Configure Target tool, select the desired baud rate, and then select Advanced to view the corresponding BTR values. Permissions may include Get/Set, Stopped.

In some embodiments, Comm State (ring) may be a read-only property describing the current communication state of the CAN controller. The ring may enumerate the following states: Error Active, Comm Warning, Error Passive, Bus Off. This property may use interpretation of SJA1000 interrupts and bitfields (which may require more than a register read). Permissions may include Get.

In some embodiments, Comm State Change (TF) may be a boolean property that transitions from False (default) to True when the Comm State property changes value. This property transitions from True to False when you Get the Comm State property. Permissions may include Get.

In some embodiments, Comm Warning Threshold may be a property that specifies the error-counter threshold for transitions from Error Active to Comm Warning communication state. Default value comes from the Configure Target tool (Advanced dialog). Permissions may include Get/Set, Stopped.

In some embodiments, Filter Mode (ring), Filter Mask, and Filter Comparator may be properties that are analogous to the corresponding NI-CAN properties. They specify a global filter for all frames received on the port. The format may be very specific to the SJA1000. Default values come from the Configure Target tool (Advanced dialog). Permissions may include Get/Set, Stopped.

In some embodiments, the NI-CAN performs bit conversions to improve the usability of these properties. To avoid that in order to save FPGA gates, a different bit format may be used.

In some embodiments, Frame Error may describe the last frame error that occurred on the network. A frame error may be a defective frame that increases the Receive or Transmit Error Counter. The information in this property may be a simplification of the SJA1000 Error Arb Capture property, in that it may be provided in a hardware-independent manner. Permissions may include Get.

In some embodiments, Listen Only (TF) may enable listen-only mode for passive monitoring/logging. The SJA1000 is a CAN controller that provides this feature. Default values come from the Configure Target tool. Permissions may include Get/Set and Stopped.

In some embodiments, features may include Log Transmit Success (TF), Log Transmit Request (TF), Log Transmit Aborted (TF), Log Comm State Change (TF), Log Transceiver Mode Change (TF), and Log SJA1000 Error Capture (TF). These are a collection of boolean properties that enable special logging features. When set to True, a special frame may be logged to describe the event. This provides a very detailed statistical analysis of CAN traffic without the additional effort of querying properties to create the information manually. The user's code can focus on simply reading and logging frames. Default values come from the Configure Target tool (Advanced dialog). Permissions may include Get/Set and Stopped. These properties may be yellow features of cRIO CAN.

In some embodiments, Transmit Success (InfoA value of 1) may be logged when a transmit request is successfully acknowledged. This may correspond to a False to True transition of the Transmit Success property. The timestamp may be analogous for a received frame (EOF time). The Identifier, Type, and Data may be the same as originally provided to Write. The InfoB field may be zero.

In some embodiments, Transmit Request (InfoA value 2) may be logged when a frame begins transmission (request for transmit). This may not necessarily be the time of Write, but rather the actual time that the frame begins to arbitrate on the network (time module writes frame to SJA1000). The timestamp may indicate the transmit request time. The Identifier, Type, and Data may be the same as originally provided to Write. The InfoB field may be zero.

In some embodiments, Transmit Aborted (InfoA value 3) may be logged when a transmit request is successfully aborted. This may occur when you invoke the Abort Transmit method, and the abort succeeds (i.e., stopped during arbitration phase). The timestamp indicates the transmit abort time. The Identifier, Type, and Data may be the same as originally provided to Write. The InfoB field may be zero.

In some embodiments, Comm State Change (InfoA value 4) may be logged when Comm State changes. This may correspond to a False to True transition of the Comm State Change interface property. The timestamp may indicate the time of the change. The Identifier and InfoB may be zero. The Type may be Comm Info (2). Data Length may be 4. Data[0] may be the old Comm State, Data[1] may be the new Comm State, Data[2] may be the Receive Error Counter, and Data[3] may be the Transmit Error Counter.

In some embodiments, Transceiver Mode Change (InfoA value 5) may be logged when the Transceiver Mode property changes. This may occur due to a local Set from Normal to Sleep or a remote wakeup from Sleep to Normal. The timestamp indicates the time of the change. The Identifier and InfoB may zero. The Type may be Transceiver Info (3). In some embodiments, Data Length may be 3. Data[0] may be the old Transceiver Mode, Data[1] may be the new Transceiver Mode. Data[2] may be the Transceiver Fault property.

In some embodiments, SJA1000 Error Capture (InfoA value 6) may be logged when a new frame error occurs, or when a new arbitration loss occurs. This may correspond to a False to True transition of either the NEWECC or NEWALC bits of the SJA1000 Error Arb Capture property. The timestamp may indicate the time of the frame error or arbitration loss. The Identifier and InfoB may be zero. The Type may be Comm Info (2). The Data may include the value of SJA1000 Error Arb Capture property in Data[0] to Data[3].

In some embodiments, Module.Serial Number may require cRIO EEPROM property and may be different for each module. It may include the permissions of Get. In some embodiments, Module.Vendor ID may require cRIO EEPROM property (0x1093 for National Instruments). Permissions may include Get. In some embodiments, Module.Module ID to require cRIO EEPROM property. Permissions may include Get. In some embodiments, Module.Class ID may require cRIO EEPROM property. Permissions may include Get. In some embodiments, Module.Revision may require cRIO EEPROM property and may be different for each hardware revision of the module. Permissions may include Get.

In some embodiments, Receive Available (TF) which may be a boolean property transitions from False (default) to True when a frame may be successfully received, and may be available to Read. The property transitions from True to False when Read obtains the last frame (FIFO or other buffer may be empty). You use this property in order to invoke Digital Port Input (Read) in a non-blocking manner. Within the diagram, you Get this property, and invoke Read only when this property may be True. Permissions may include Get.

In some embodiments, Receive Error Counter which may access to the Receive Error Counter defined by the CAN standard. Many CAN controllers may provide this as read-only. Permissions may include Get.

In some embodiments, SJA1000 Error Arb Capture which may be a property that returns the Error Code Capture Register and the Lost Arbitration Capture register of the Phillips SJA1000 CAN controller. These registers may provide detailed information on frame errors (which increment the receive/transmit error counters), and lost arbitrations (which do not increment the counters). This information may be useful for analysis of overall CAN traffic. In addition to the register values, this property includes two bits that indicate whether each register has captured a new value since the last Get for this property. This may include Series 2 Error/Arb Capture attribute of M-CAN (Frame API for LabVIEW, ncGetAttr.vi). Permissions may include Get.

In some embodiments, Single Shot Transmit (TF) may enable single shot transmit mode. Default may be False. Permissions may include Get/Set and Stopped/Running. This property may be used in a special frame.

In some embodiments, Transceiver Fault (TF) may be a boolean property that returns the state of the transceiver's NERR signal. False indicates no fault (NERR true), and True indicates a fault. Permissions may include Get.

In some embodiments, Transceiver Mode (ring) may set the mode for the CAN transceiver, as well as the associated mode in the CAN controller. For High-Speed (HS) transceivers, this may use two values: Normal (0) and Sleep (1). The Sleep mode can be set when the CAN controller is running. Once the transceiver may be set into Sleep mode, the user may Wait for an external wakeup by using the Transceiver Wakeup condition. Permissions may include Get/Set and Running.

In some embodiments, Transmit Available (TF) may be a boolean property that transitions from False to True (default) when a transmit entry may be available for Write. This property transitions from True to False when Write cannot accept new transmit requests (FIFO or other buffer may be full). A user may use this property in order to invoke Digital Port Output (Write) in a non-blocking manner. Within the diagram, a user may Get this property, and invoke Write only when this property may be True. Permissions may include Get. When the Transmit FIFO Enable property may be False, this property may be the same as the Transmit Complete property, because a transmit request may be pending. When the Transmit FIFO Enable property is True, this property may be True when the Transmit Complete property is False, because multiple transmit requests may be pending in the FIFO.

In some embodiments, Transmit Complete (TF) may be a boolean property that transitions from False to True (default) when all pending transmit requests (frames provided to Write) may complete. A transmit request may be complete when it is acknowledged (Transmit Success) or you invoked the Abort Transmit method. This property transitions from True to False when Write may be invoked (transmit pending). Permissions may include Get.

In some embodiments, Transmit Error Counter may allow access to the Transmit Error Counter defined by the CAN standard. Almost all CAN controllers provide this as read-only. Permissions may include Get.

In some embodiments, Transmit FIFO Enable (TF) may be a boolean property that specifies whether to use a FIFO for transmission of CAN frames. The default value may be True. When this property is True, the cRIO CAN module may buffer sequential transmit requests (Write functions) in order to transmit the frames at an increased bus load. This behavior may be very useful for playback of logfiles, or other test applications which require high bus load. When this property may be True, the Abort Transmit method cannot be used. When this property is False, a transmit request may be pending, but you can abort that pending transmit with the Abort Transmit method. This behavior enables implementation of embedded CAN protocols that require re-prioritization of pending transmit requests based on the arbitration ID. If a low-priority ID is pending, and it is time to transmit a high-priority ID, the user may abort the low-priority ID in order to transmit the high-priority ID first. Permissions may include Get/Set and Stopped.

In some embodiments, Transmit Success (TF) may be a boolean property that transitions from False to True (default) when a transmitted frame is acknowledged by another node. This property transitions from True to False when Write is invoked (transmit pending). This property may be used in conjunction with the Abort Transmit method. After invoking Abort Transmit, Wait for Transmit Complete, then Get the Transmit Success property to determine if the abort was too late (already transmitted successfully). Permissions may include Get.

In some embodiments, Digital I/O (Read/Write) may include a Timeout property that may be provided in a module-specific tab. The tab may use a different value for each node. Otherwise, it may be provided in the I/O Property Node as a module-wide property. If the module specifies that it has digital input resources, those resources may be selectable from the digital input node.

In some embodiments, the Comm State, Filter Mode, and Transceiver Mode properties may use enumerated lists for their value. In NI-CAN, a user may use a ring typedef (type definition) because the user may create controls/indicators directly from the VI. Since LV FPGA uses scripting, ring typedefs may be created as a simple numeric control/indicator, so the enumerated list may be lost. Since LV retains the list for enum typedefs across the scripting, using that instead of ring may provide the desired usability. That may be why we use an enum typedef for Wait (because the list may be very important). The downside to enum typedefs may be that they violate localization rules (cannot be localized in future).

In some embodiments, Frame Error property may provide compatibility to transition diagrams for cRIO to future LV Embedded targets. The SJA1000 Error Arb Capture property may provide the same information, but in a format that may be specific to the SJA1000, and therefore non-portable.

In some embodiments, SJA1000 Error Arb Capture property may be provided in four separate properties: Arbitration Loss Details, Frame Error Details, New Arbitration Loss, and New Frame Error. NI-CAN may consolidate all four of these values into a single property, since they may be related in the SJA1000, and may provide very low-level information. Separate register reads may be easier to implement in LV FPGA. By providing some simple logic in the module, this may be provided as a single property, and therefore may reduce LV FPGA gates, plus provide better usability and compatibility to NI-CAN.

In some embodiments, Single Shot Transmit may be a Frame type (InfoA) or a property. The Single Shot Transmit property may be commonly used to test for the presence of other nodes: try a single transmit, then wait to see if it may be successful (acked). Once another node is detected, the user may change from True back to False. The SJA1000 may change this property dynamically. This may be exposed as a special frame type (InfoA value) instead of a property.

In some embodiments, Transceiver Mode may support external transceivers. For NI-CAN, a separate set of properties may be provided to access the DIO signals for external transceivers. Similar properties may be defined for cRIO or integrated into Transceiver Mode and Transceiver Fault properties.

In some embodiments, Transceiver Type may be returned with Module.Class ID to provide information on whether each port may be HS/LS/SW/Ext. A Transceiver Type property (Get only) may also be used.

In some embodiments, Transmit FIFO Enable may use a length property. Users may inquire into the length of the transmit FIFO. This may be 1 or 2 frames pending, for example, to enable additional FIFO within LV FPGA. With more than two pending frames, users may request a configurable length.

In some embodiments, Error terminals may include Conventions. The code may match an NI Error Database entry (i.e. so Explain Error works during debugging). The source may also be filled in.

In some embodiments, in LV FPGA Arbitration, "Normal" and "None" may result in fewer gates when a user knows they will use one or multiple nodes.

In some embodiments, LV FPGA architecture may assume that all location information (such as an object index) may be specified in the dialog, not as a diagram input. The message-object concept may imply non-blocking Read and Write, but with some SJA1000 models, the system may always block. The user can still use Read and Write in a non-blocking manner by getting the Receive Available and Transmit Available properties within the main loop (presumably a single loop).

Since the communication to the module may take ~10 μs, this may require a simple transmit FIFO within the module. Transmit FIFOs may support prioritized transmit with reverting to a message-object model. The SJA1000 may support prioritized transmit (abort transmit). In order to support both user use cases (playback, and node simulation), a Transmit FIFO Enable property may be provided.

In some embodiments, Read/Write/Wait may use a Timeout resolution in milliseconds. "Ticks" may be inherently non-portable, and for a CAN timeout, milliseconds resolution may be adequate. The system may integrate into the Wait for Digital Line and use Ticks.

In some embodiments, Read/Write may use a Frame cluster without timestamp and may support two cluster formats, with and without timestamp. In some embodiments, a config dialog embodiment may be used to select which may be used. Porting Assistants (LV scripting) may detect a specific item in bundle/unbundled. The NI-CAN frame/channel conversion feature may require a timestamp for Write. The user may be required to interpret the timestamp within LV FPGA in order to time calls to Write.

For single-ID objects, since the ID may be pre-configured, it may be defined as a reduced frame cluster to optimize throughput. This may not apply to cRIO CAN, but may apply to message-object based designs. The ID may be kept, because most CAN controllers allow multiple IDs per message object.

In some embodiments, Baud Rate property may allow the user to configure the Target tool. The system may limit this to the dialog, but that may prevent users from implementing the auto-baud scheme, or writing a single VI that simulates different ECUs. NI-CAN design guidelines may provide access to the same properties in the API as in MAX. The rationale may be that 1) users often have additional runtime requirements, and 2) a VI itself may be a simple container. This may also apply to cRIO CAN as well.

In some embodiments, the Baud Rate property may use BTR values. Allowing basic baud rates may require a mapping table, presumably stored in the cRIO CAN module (to avoid using LV FPGA gates). The system may also use Bit Timing in order to limit to BTR only. A Baud Rate in the Configure Target tool may be provided, and the diagram-level property may use BTR values. Baud rate mapping may not use FPGA gates.

In some embodiments, multiple objects may not be read because ports/errors may be distinct. Users may select multiple CAN ports for Read. In some embodiments, a Name for Object, (e.g., Mailbox) may be provided. In message-object implementations, the term "Object" may be too vague. For example, the term "Index" or "Mailbox" may be used.

cRIO-9853

In some embodiments, the cRIO-9853 FPGA module communicates with a LV-FPGA target via, for example, 9 dedicated general-purpose I/O signals defined in the cRIO architecture. Other numbers of I/O signals may be used. For the "active" cRIO system, this physical interface may include traces on the backplane PCB; for the "passive" cRIO system, the interface may be a cable (e.g., 1 m long) from the passive backplane to a PXI-7831R board. The protocol implemented on these I/O signals may be a full-duplex, source synchronous serial communication protocol partitioned into two x2 unidirectional master/slave channels.

In some embodiments, on the "Transmit" channel (LV-FPGA to the cRIO FPGA module), the LV-FPGA may act as the master and source a clock and two independent, serialized data lines (one data line dedicated to each CAN port of a two-port module). Data may be sent by LV-FPGA synchronous to the falling edge of the clock and sampled by the cRIO FPGA module slave on the rising edge of the clock.

On the "Receive" channel (the cRIO FPGA module to LV-FPGA), the cRIO FPGA module may act as the master and source a clock and two independent, serialized data lines (one data line dedicated to each CAN port of a two-port module). Data may be sent by the cRIO FPGA module synchronous to the falling edge of the clock and sampled by the LV-FPGA slave on the rising edge of the clock. In addition to the clock and two serialized data lines, each channel may have one trigger signal, which may not be serialized, and may be used for very low-latency, low-jitter communication.

Figure 20:
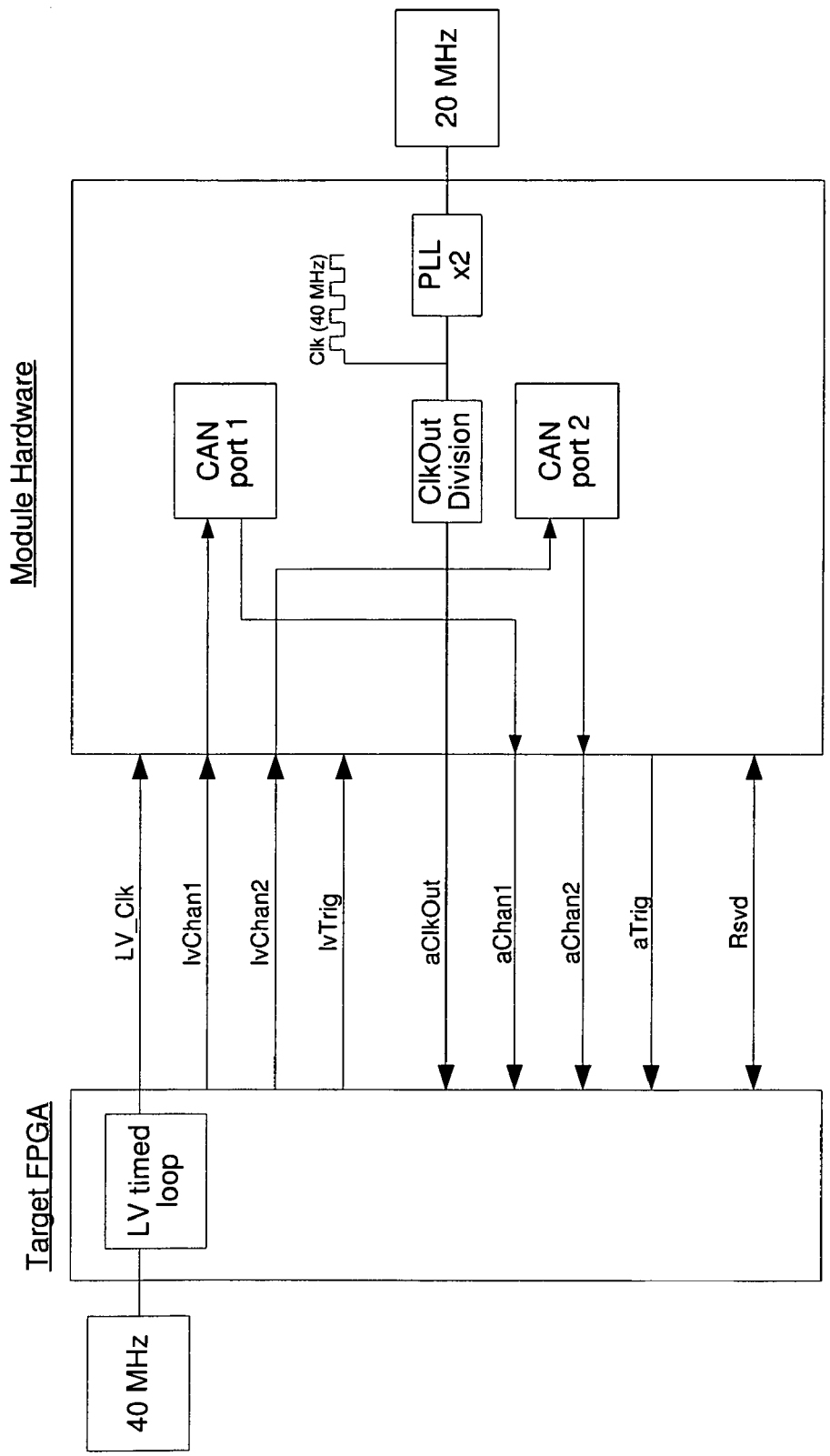
FIG. 20 illustrates an embodiment of a target FPGA and module hardware.
Figure 21:
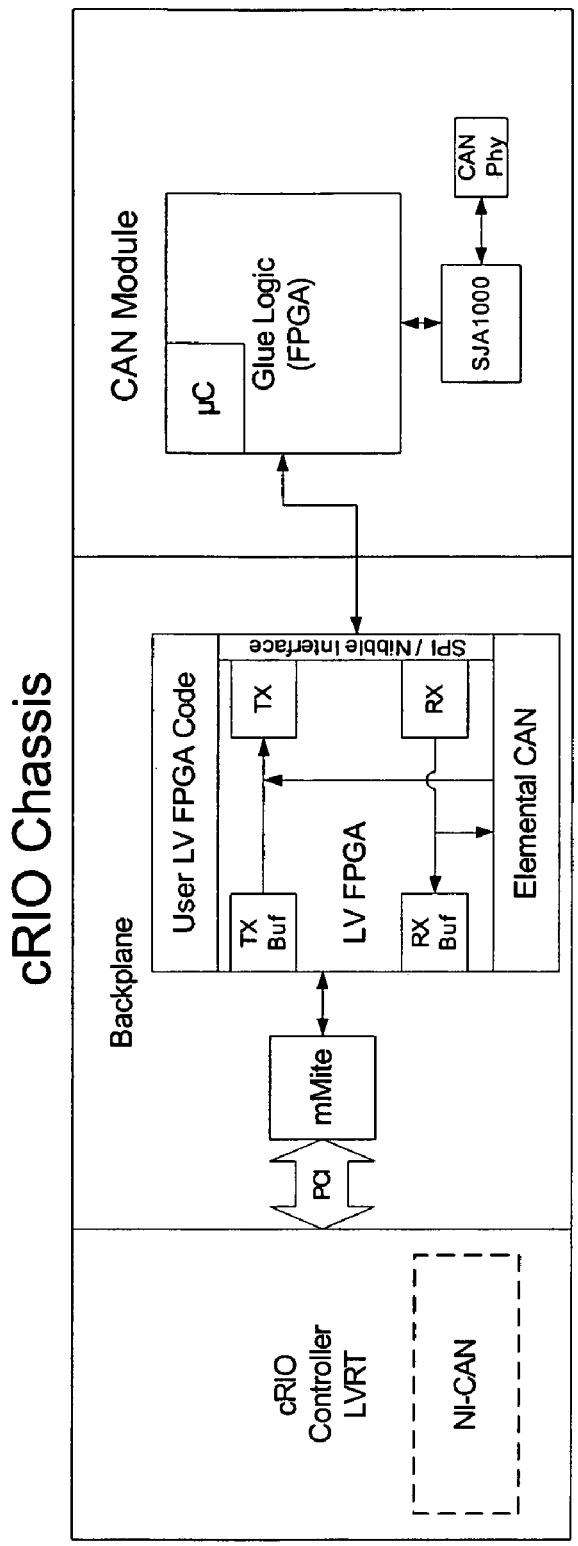
FIG. 21 illustrates an embodiment of a cRIO chassis.

FIG. 20 illustrates an embodiment of various signal lines between a target FPGA (e.g., an LV-FPGA) and module hardware (e.g., a cRIO FPGA).

| Pin Description | |
|---|---|
| Signal Name | Description |
| LV_Clk | Clock sourced by LV-FPGA based off RIO hardware on-board oscillator (40 MHz/80 MHz/120 MHz/160 MHz). Uses LV-FPGA single-cycle loop. |
| lvChan1 | Data line from LV-FPGA to the cRIO FPGA module CAN port 1. |
| lvChan2 | Data line from LV-FPGA to the cRIO FPGA module CAN port 2. |
| lvTrig | Trigger signal from LV-FPGA to the cRIO FPGA module. |
| aClkOut | Clock sourced by the cRIO FPGA module based off module Clk. The frequency of aClkOut can be set via the ClkOut Divisor register. |
| aChan1 | Data line from the cRIO FPGA module CAN port 1 to LV-FPGA. |

-continued

| Pin Description | |
|---|---|
| Signal Name | Description |
| aChan2 | Data line from the cRIO FPGA module CAN port 2 to LV-FPGA. |
| aTrig | Trigger signal from the cRIO FPGA module to LV-FPGA. |
| Rsvd | Reserved. |

In some embodiments, a dedicated data line may be used for each CAN port so traffic on one port does not adversely affect the latency of the other port. Symmetric transmit and receive channels may enable the ability to both transmit and receive full busloads to and from the CAN bus, specific to use cases requested by users.

Despite dedicated channels for each CAN port, the cRIO-9853 may have a shared Address/Data bus architecture, so in reality only one CAN port may be accessed at any point in time. This shared bus interface may save power and cost by reducing the number of additional FPGA I/O and level translators that are necessary for a parallel bus architecture. The CAN controller interface may also be parallel.

In some embodiments, packet types may include transmit packets and receive packets. Below are provided examples of possible packets. Other packets may also be used. Transmit Packets (data flows from LV-FPGA to the cRIO FPGA module) may include Config Data packets (to write configuration data to SJA1000s), Config Request packets (to request to read configuration data from SJA1000s), CAN Frame packets (data to be written to CAN bus), and Event packets (register-like interface for commands, triggers, etc). Receive Packets (data flows from the cRIO FPGA module to LV-FPGA) may include Config Data packets (to return requested configuration data from SJA1000s), CAN Frame packets (data read from CAN bus), Event packets (register-like interface for status, triggers, etc), and Error packets (to indicate the cRIO FPGA module detected an error (invalid header, CRC error, etc) and requests re-training). These packets may be sent in a "store-and-forward" manner, i.e. the serial communication protocol may wait until the entire packet of data is ready before beginning to send any portion. This may be because the SJA1000 generates an interrupt when all frame data may be available to be read out (essentially an ISR implemented in the FPGA).

| Packet Formats | | | | |
|---|---|---|---|---|
| Basic Packet Format: | | | | |
| SOP | Header[3:0] | Payload | CRC[15:0] | (Idle) |
| (1 bit) | (4 bits) | (20-188 bits depending on packet) | (16 bits) | (0+ bits) |

SOP - A Start of Packet always begins with a '1'.
Header - Indicates the packet type as follows:

| Header[3:0] | Packet type |
|---|---|
| 0x0 | Config Data |
| 0x1 | CAN Frame |
| 0x2 | Event |
| 0x3 | Config Request |
| 0x4-0xF | Reserved |

Payload—The payload portion of the packet as indicated in the specific packet descriptions below.

CRC (Cyclical Redundancy Checking)—Checksum calculated on the Header and Payload portions of the packet. CRC may use the standard CRC-16/CCITT algorithm.

Idle—The bus idles at '0' until the next packet may be ready to begin. The minimum idle time may be zero bits. Therefore, if a packet may be ready immediately following the completion of the preceding packet, there may be no idle bits inserted. The next bit following the last bit of CRC may be the SOP '1'.

| Config Data packet format: | | |
|---|---|---|
| Header[3:0] | ConfigAddr[11:0] | ConfigData[7:0] |
| (4 bits) | (12 bits) | (8 bits) |

Header—0x0 indicates Config Data packet type.

ConfigAddr—Destination address of configuration packet. All devices on the cRIO-9853 Module may be mapped into a single address space. Each SJA1000 requires 128 bytes of addressing, or 256 bytes total for a 2-port module. A 12-bit ConfigAddr field supports 4 Kbytes of total address space for future expansion if necessary.

ConfigData—Configuration data byte.

| Config Request packet format: | | |
|---|---|---|
| Header[3:0] | ConfigAddr[11:0] | RSVD[7:0] |
| (4 bits) | (12 bits) | (8 bits) |

Header—0x3 indicates Config Request packet type.

ConfigAddr—Address of requested configuration packet.

RSVD—Data field may be ignored for this packet type; reserved for future use.

RSVD—Reserved field for future expansion; may be ignored.

CAN ID—Arbitration ID of the CAN Frame packet. The two msbs, CAN ID[31:30] may unused; CAN ID[29] indicates the arbitration ID type as follows:

0—Standard 11-bit ID

1—Extended 29-bit ID

CAN ID[28:0] may used for the actual ID. For a standard 11-bit ID, the least-significant 11-bits may used, so CAN ID[28:11]=000000000000000000 and CAN ID[10:0] standard ID. This follows the NI-CAN API convention.

Data—8 bytes of CAN data. Invalid data bytes (as indicated by the Data Length field) may ignored.

Timestamp—52-bit timestamp of CAN frame. For a Received CAN frame, this may be the timestamp of when the message was received from the CAN bus; for a Transmitted CAN frame, this field may be ignored, but may be reserved for future use to indicate the time when a message may be transmitted to the CAN bus (i.e. playback mode feature). The API may return a 64-bit value for the timestamp, but possibly only the lower 52-bits may be valid. The timestamp may be limited to 52 bits due to an implementation limitation of the Cyclone FPGA architecture M4K block RAM in conjunction with the NiCore FIFO component. Each Cyclone M4K may be configured as wide as 128×36. A wider FIFO may automatically concatenate multiple M4K blocks, which is the case for cRIO FPGA module which may require a total of 4 FIFOs, each as wide as the longest packet. The Cyclone EP1C6 device may have 20 M4K blocks, which means each of the 4 FIF)s may use 5 M4Ks, thus limiting the longest packet length to 180 bits. This leaves 52 bits for the Timestamp field, which at 100 ns resolution still only rolls over every 14.27 years.

| CAN frame packet format: | | | | | | |
|---|---|---|---|---|---|---|
| Header[3:0] | Data Length[3:0] | FrameType[7:0] | RSVD[15:0] | CAN ID[31:0] | Data0[7:0]-Data7[7:0] | Timestamp[63:0] |
| (4 bits) | (4 bits) | (8 bits) | (16 bits) | (32 bits) | (64 bits) | (64 bits) |

Header—0x1 indicates CAN Frame packet type.

Data Length—Indicates the number of valid data bytes in the Data field, ranging from 0 to 8.

FrameType—Identifies the type of CAN frame (from CAN specification) as follows:

| FrameType[7:0] | CAN frame type |
|---|---|
| 0x00 | Data frame |
| 0x01 | Remote frame |
| 0x02 | Comm info (bus state) |
| 0x03 | Transceiver info |
| 0x04-0xFF | Reserved |

| Event packet format: | | |
|---|---|---|
| Header[3:0] | EventAddr[3:0] | EventData[15:0] |
| (4 bits) | (4 bits) | (16 bits) |

Header—0x2 indicates Event packet type.

EventAddr—Event address. Supports up to 16 "event" registers, each 16-bits wide.

EventData—Event data. Used to update status information, send trigger information, etc.

| Error packet format: | | |
|---|---|---|
| Header[3:0] | ErrorAddr[3:0] | ErrorData[15:0] |
| (4 bits) | (4 bits) | (16 bits) |

Header—0xA indicates Error packet type.
ErrorAddr—Error address. Supports up to 16 "error" registers, each 16-bits wide.
ErrorData—Error data. Used to indicate nature of error.

Reset/Training Sequence/CRC Error

In some embodiments, a sequence of 255 consecutive 1's at any point in time may be interpreted as the training sequence. A training sequence may be used to synchronize master and slave sides of the interface. On power-up, the LV-FPGA master side may commence the reset process by sending the training sequence to the cRIO FPGA module on the Transmit channel. The cRIO FPGA module may respond by sending the training sequence back on the Receive channel. Note that the LV-FPGA may initiate the training process and the cRIO FPGA module acknowledges it to complete the process, so a full reset may include:

LV-FPGA: send training sequence; then wait for acknowledge by the cRIO FPGA module.

The cRIO FPGA module: idle until receive training sequence from LV-FPGA; then acknowledge with training sequence.

This ordering of the reset process may avoid a circular reset condition whereby both channels continuously acknowledge training sequences back and forth. This initial reset process may complete before any communication begins and may also be used to recover from a loss of synchronization condition between the master and slave.

If the cRIO FPGA module detects an invalid header, or CRC error, it may indicate an error to LV-FPGA and request re-training. This may be done via an Error packet from the cRIO FPGA module to LV-FPGA. The cRIO FPGA module may not immediately send the Error packet upon detecting a problem; instead it may wait, for example, 255 bit times to distinguish if the packet in question may be an error or a training sequence. If the packet generating the potential error may be a training sequence, the cRIO FPGA module may respond with the training sequence acknowledge and communication can continue. This may be the typical reset procedure described above. If, however, after waiting 255 bit times the cRIO FPGA module determines that there may be an error (not a training sequence), it may respond with an Error packet to LV-FPGA. At that point, LV-FPGA may begin the normal training process.

Any packet that generates an error may be considered faulty, and therefore a system-level error may be indicated to the user. An attempt may not be made to re-transmit the erroneous packet. Note that the training sequence length of 255 bits may be longer than the longest possible packet to avoid a false reset.

Arbitration

In some embodiments, arbitration for the cRIO FPGA module to LV-FPGA channel may be controlled by a FIFO mechanism on the cRIO FPGA module. A state machine on the cRIO FPGA module may continually monitor the status of the FIFO; when a packet becomes available in the FIFO, it may be sent across the channel as soon as possible. Arbitration for the LV-FPGA to the cRIO FPGA module channel may be controlled by the LV-FPGA resource VIs. This scheme may ensure fairness, as each packet source may be given equal access to the channel resource; packets may sent out in a first-in, first-out order.

In some embodiments, the worst-case latency of any packet reaching the slave may be dependent on the traffic over the interface, the depth of the FIFO, and the bit rate of the channel. In some embodiments, a FIFO depth may have 4 packets, with one of each type of packet in the FIFO, the latency may be: E+CF+CD+R where E=Event packet transmission time, CF=CAN Frame packet transmission time, CD=Config Data packet transmission time and R=Error packet transmission time. Given that the minimum possible period between consecutive CAN frames appearing on the bus may be about 50 μs, and also given the respective packet transmission times, there may not be a case when multiple packets become queued up for access to the channel. Therefore E+CF+CD+R may be an accurate worst-case latency. Note that the TRIG lines may not require arbitration, as there may be only one source that can possess the TRIG line resource.

| | Timing | | | | |
|---|---|---|---|---|---|
| CLK rate | Config Data packet (41 bits total) | CAN Frame packet (197 bits total) | Event packet (41 bits total) | Error packet (41 bits total) | Worst-case latency (round-robin scheme) |
| 5 MHz | 8.20 μs | 39.40 μs | 8.20 μs | 8.20 μs | 64.00 μs |
| 10 MHz | 4.10 μs | 19.70 μs | 4.10 μs | 4.10 μs | 32.00 μs |
| 20 MHz | 2.05 μs | 9.85 μs | 2.05 μs | 2.05 μs | 16.00 μs |
| 40 MHz | 1.025 μs | 4.925 μs | 1.025 μs | 1.025 μs | 8.00 μs |

CRC

In some embodiments, CRCs may compute using the standard CRC-16/CCITT algorithm, which may have the following properties: Width=16 bits; Polynomial=0x1021 ($x^{16}+x^{12}+x^{5}+x^{0}$); Initial value=0xFFFF; Input data may be NOT reflected; Output CRC may be NOT reflected; and No XOR may be performed on the output CRC.

In some embodiments, this CRC may be able to detect the following errors: single bit errors (one bit in error between transmitted checksum and received checksum); double bit errors (two bits in error between transmitted checksum and received checksum); errors with an odd number of bits (one, three, five, . . . bits in error); and burst errors up to 16-bit in length.

In some embodiments, a 16-bit CRC may be chosen over a 32-bit CRC for the several reasons. There is less overhead in communication protocol resulting in higher payload bandwidth and lower latency. It can be calculated faster and with less logic utilization. There is a low expected error rate over transmission media, and there is no error correction or retry built into protocol.

CAN Module for cRIO

In some embodiments, the system may provide CAN connectivity to the cRIO platform in the form of a CAN module. The CAN module may allow users to use cRIO for automotive applications such as in-vehicle data logging and rapid control prototyping. The system may also be useful in non-automotive embedded machine control applications that require CAN, DeviceNet and CANopen connectivity.

Figure 22:
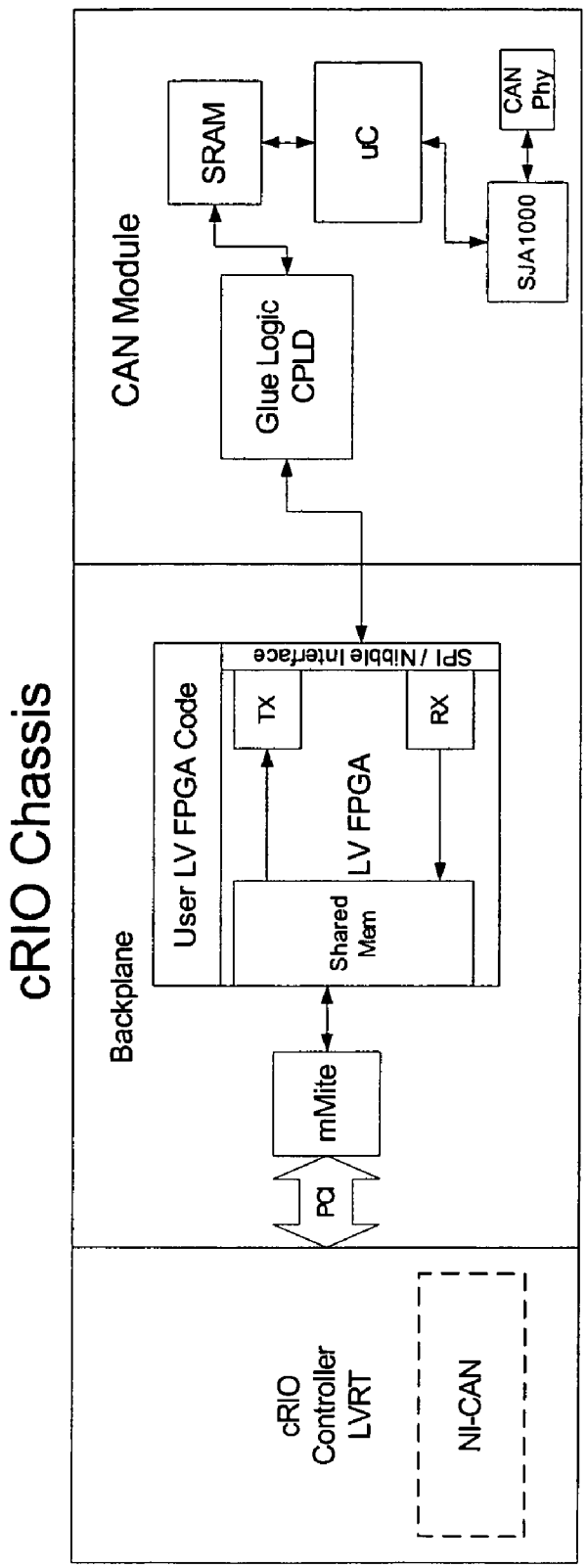
FIG. 22 illustrates another embodiment of a cRIO chassis.

In some embodiments, there may be several ways that the CAN module could be implemented. As seen in FIG. 22, an embodiment may implement a new 'Series 3' CAN architecture. This architecture may move most of the timed events to an FPGA. This may allow μS accuracy on the time stamps and low jitter on periodic transmit events. It may also enable transmit of substantially 100% busload for simulation. Control and simulation applications may require this higher accuracy. The system may reuse the 'Series 3' architecture in new applications such as USB-CAN, ENET-CAN, ExpressCard, and PCIExpress CAN. The 'Series 3' architecture may allow the system to distinguish CAN systems from other systems. The interface between the host processor and the CAN card may be simplified to a message buffer mechanism. This may allow the CAN module to leverage existing LV FPGA register access.

In some embodiments, benefits may include higher accuracy time events, higher speed transmit, clearly distinguished features, and may be better suited to control and simulation applications. In some embodiments, the systems may be leveraged in to new systems and to upgrade existing CAN systems.

In some embodiments, as seen in FIG. 23, the system may leverage the existing 'Series 2'CAN architecture. This may allow the most re-use of existing software driver and firmware designs. It may still require significant hardware and firmware design effort. 'Series 2' CAN hardware may consume approximately 2.5 W of power. In some embodiments, a μP may be used to reduce the power consumption to cRIO levels. This embodiment may port the existing CAN firmware to this new μP. The 'Series 2' CAN architecture may cause time events (transmit periodic, transmit triggered, message timestamping) to have significant jitter. This may be because these events may be processed at interrupt time or by scheduling threads in the NINU OS on the μP. The 'Series 2' CAN architecture may rely on a 8 kB Shared memory interface to communicate between the host and the CAN μP. This 8 k memory has very low latency (<1 μs). Benefits may include re-use of existing CAN designs and faster time to market.

In some embodiments, the CAN cRIO module may be essential to connect the cRIO platform to automotive systems. In automotive, it may be used mainly in data logging and Rapid Control Prototyping applications. The CAN module may also be useful for controlling I/O nodes within a machine with LabVIEW RT. In some embodiments, standard CAN (ISO 11898) may be used, but CANopen or DeviceNet may likely be requested. CANopen and DeviceNet run on CAN hardware.

In some embodiments, using an analogy to DAQ systems, the complexity of the NI-CAN driver may be closer to NI-DAQ (multiple high-speed buffers) than Elemental I/O (simple register access). For example, messages received from each port may copy at interrupt-time (possibly DMA) into a single buffer, which may be then parsed out to independent buffers per message, and then into independent buffers per channel.

In order to manage the complexity of the driver, NI-CAN may make extensive use of NI-PAL to isolate code from OS and other platform details. This may enable a common driver design to focus on providing benefit to users, not on OS or other platform details. NI-PAL may be used for enumeration (finding hardware), interrupts, memory, mutexes, kernel/user transitions, and more cRIO may provide NI-PAL services for enumeration, interrupts, or DMA.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A computer-implemented method, comprising:
creating a graphical program, wherein the graphical program comprises a plurality of connected nodes which visually indicates functionality of the graphical program, wherein the graphical program comprises at least one node that specifies a communication packet;
converting the graphical program into a hardware description;
deploying the hardware description to a target programmable hardware element;
executing the target programmable hardware element, wherein said executing comprises transferring the communication packet from the target programmable hardware element to first circuitry, wherein the communication packet is useable by the first circuitry to perform an operation, wherein the first circuitry comprises peripheral interface circuitry;
the peripheral interface circuitry translating at least part of the transferred communication packet into a command; and
transferring the command to one or more peripheral chips.

2. The method of claim 1, wherein the peripheral chips are network chips on a controller area network (CAN).

3. The method of claim 1, wherein the peripheral chips are protocol controller chips.

4. The method of claim 1, further comprising:
the target programmable hardware element receiving a communication packet transmitted from the peripheral chips.

5. The method of claim 1, wherein said transferring the communication packet comprises transmitting the communication packet in accordance with a serial protocol.

6. The method of claim 1, wherein the first circuitry is a reconfigurable hardware element.

7. The method of claim 1,
wherein the graphical program comprises a graphical data flow program.

8. The method of claim 1,
wherein the graphical program is executable on the target programmable hardware element to perform one or more of:
an industrial automation function;
a process control function;
a test and measurement function.

9. A system, comprising:
a processor;
a memory coupled to the processor, wherein the memory stores a graphical program, wherein the graphical program comprises a plurality of connected nodes which visually indicates functionality of the graphical program, wherein the graphical program comprises at least one node that specifies a communication packet;
a target programmable hardware element coupled to the processor; and
first circuitry coupled to the target programmable hardware element;
wherein the memory further stores program instructions executable by the processor to:
convert the graphical program into a hardware description; and
deploy the hardware description on the target programmable hardware element;
wherein, after the hardware description is deployed on the target programmable hardware element, the target programmable hardware element is executable to;

transfer the communication packet from the target programmable hardware element to the first circuitry, wherein the communication packet is useable by the first circuitry to perform an operation;

wherein the first circuitry comprises peripheral interface circuitry, and wherein the peripheral interface circuitry is operable to:

translate the transferred communication packet into a command; and transfer the command to one or more peripheral chips.

10. The system of claim 9, wherein the peripheral chips are network chips on a controller area network (CAN).

11. The system of claim 9, wherein the peripheral chips are protocol controller chips.

12. The system of claim 9, wherein after the hardware description is deployed on the target programmable hardware element, the target programmable hardware element is executable to:

receive a communication packet transmitted from the peripheral chips.

13. The system of claim 9, wherein to transfer the communication packet from the target programmable hardware element to the first circuitry, the target programmable hardware element is executable to:

transmit the communication packet in accordance with a serial protocol.

14. The system of claim 9, wherein the first circuitry is a reconfigurable hardware element.

15. The system of claim 9, wherein the graphical program is executable on the target programmable hardware element to perform one or more of:

an industrial automation function;

a process control function;

a test and measurement function.

16. A computer-readable memory medium comprising program instructions for creating and deploying a graphical program, wherein the memory medium stores:

a graphical program, wherein the graphical program comprises a plurality of connected nodes which visually indicates functionality of the graphical program, wherein the graphical program comprises at least one node that specifies a communication packet and a write operation of the communication packet;

first program instruction executable to:

convert the graphical program into a hardware description; and deploy the hardware description on a target programmable hardware element;

wherein, after the hardware description is deployed on the target programmable hardware element, the target programmable hardware element is executable to write the communication packet to a destination;

wherein the destination comprises peripheral interface circuitry, and wherein the peripheral interface circuitry is operable to:

translate the transferred communication packet into a command; and transfer the command to one or more peripheral chips.

* * * * *

UNITED STATES PATENT AND TRADEMARK OFFICE
CERTIFICATE OF CORRECTION

| | | |
|---|---|---|
| PATENT NO. | : 7,594,226 B2 | Page 1 of 1 |
| APPLICATION NO. | : 11/203805 | |
| DATED | : September 22, 2009 | |
| INVENTOR(S) | : Stelzer et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1073 days.

Signed and Sealed this

Twenty-eighth Day of September, 2010

David J. Kappos
*Director of the United States Patent and Trademark Office*